(12) United States Patent
Sawayama et al.

(45) Date of Patent: Dec. 29, 2015
(10) Patent No.: US 9,224,777 B2

(54) SOLID-STATE IMAGE PICKUP DEVICE AND METHOD FOR MANUFACTURING SOLID-STATE IMAGE PICKUP DEVICE

(75) Inventors: Tadashi Sawayama, Machida (JP); Hiroshi Ikakura, Kawasaki (JP); Takaharu Kondo, Yokohama (JP); Toru Eto, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 835 days.

(21) Appl. No.: 13/365,055

(22) Filed: Feb. 2, 2012

(65) Prior Publication Data

US 2012/0202310 A1    Aug. 9, 2012

(30) Foreign Application Priority Data

Feb. 9, 2011 (JP) .................................. 2011-026346
Oct. 7, 2011 (JP) ................................. 2011-223302

(51) Int. Cl.
*H01L 21/00* (2006.01)
*H01L 27/146* (2006.01)

(52) U.S. Cl.
CPC .... *H01L 27/14629* (2013.01); *H01L 27/14641* (2013.01); *H01L 27/14685* (2013.01); *H01L 27/14621* (2013.01); *H01L 27/14627* (2013.01);
(Continued)

(58) Field of Classification Search
CPC .................. H01L 27/14685; H01L 27/14629; H01L 27/14621; H01L 27/14627; H01L 27/14636; H01L 27/14643; H01L 27/146; H01L 27/14665
USPC .............. 438/31, 69, 703; 257/291, 432, 461, 257/E31.127, E31.119, E27.13, E27.133
See application file for complete search history.

(56) References Cited

U.S. PATENT DOCUMENTS 7,524,690 B2 * 4/2009 Ko et al. ......................... 438/31
2003/0110808 A1   6/2003 M'Saad
(Continued)

FOREIGN PATENT DOCUMENTS

CN       1745478 A    3/2006
CN     101425525 A    5/2009
(Continued)

OTHER PUBLICATIONS

J. Yota et al., "Comparison between HDP CVD and PECVD Silicon Nitride for Advanced Interconnect Applications;" Proceedings of the IEEE 2000 International Interconnect Technology Conference; Jan. 1, 2000; pp. 76-78; XP055126578.

*Primary Examiner* — Kheim D Nguyen
(74) *Attorney, Agent, or Firm* — Canon USA, Inc. IP Division

(57) ABSTRACT

A method for manufacturing a solid-state image pickup device that includes a substrate including a photoelectric conversion unit and a waveguide arranged on the substrate, the waveguide corresponding to the photoelectric conversion unit and including a core and a cladding, includes a first step and a second step, in which in the first step and the second step, a member to be formed into the core is formed in an opening in the cladding by high-density plasma-enhanced chemical vapor deposition, and in which after the first step, in the second step, the member to be formed into the core is formed by the high-density plasma-enhanced chemical vapor deposition under conditions in which the ratio of a radio-frequency power on the back face side of the substrate to a radio-frequency power on the front face side of the substrate is higher than that in the first step.

10 Claims, 15 Drawing Sheets

(52) U.S. Cl.
CPC ..... *H01L 27/14636* (2013.01); *H01L 27/14643* (2013.01)

(56) References Cited

U.S. PATENT DOCUMENTS

| | | | | |
|---|---|---|---|---|
| 2008/0135732 | A1* | 6/2008 | Toumiya et al. | 250/208.1 |
| 2009/0023292 | A1* | 1/2009 | Hashimoto | 438/703 |
| 2009/0215281 | A1* | 8/2009 | Mungekar et al. | 438/786 |
| 2010/0078638 | A1 | 4/2010 | Lee | |
| 2010/0078745 | A1* | 4/2010 | Wano et al. | 257/432 |
| 2010/0167533 | A1* | 7/2010 | Lim et al. | 438/655 |

FOREIGN PATENT DOCUMENTS

| | | |
|---|---|---|
| CN | 101714567 A | 5/2010 |
| JP | 2005-251804 A | 9/2005 |
| JP | 2010-103458 A | 5/2010 |
| JP | 2010-283145 A | 12/2010 |
| KR | 10-2008-0111624 A | 12/2008 |
| KR | 10-2010-0036200 A | 4/2010 |

* cited by examiner

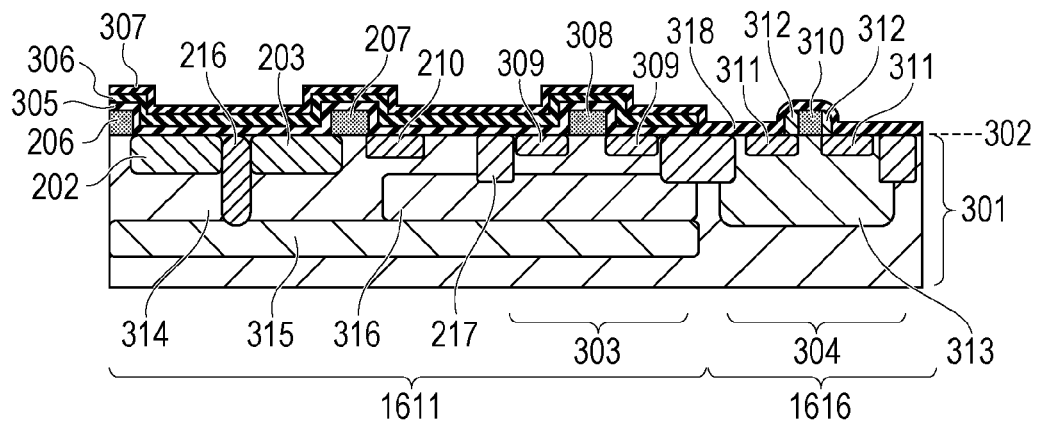
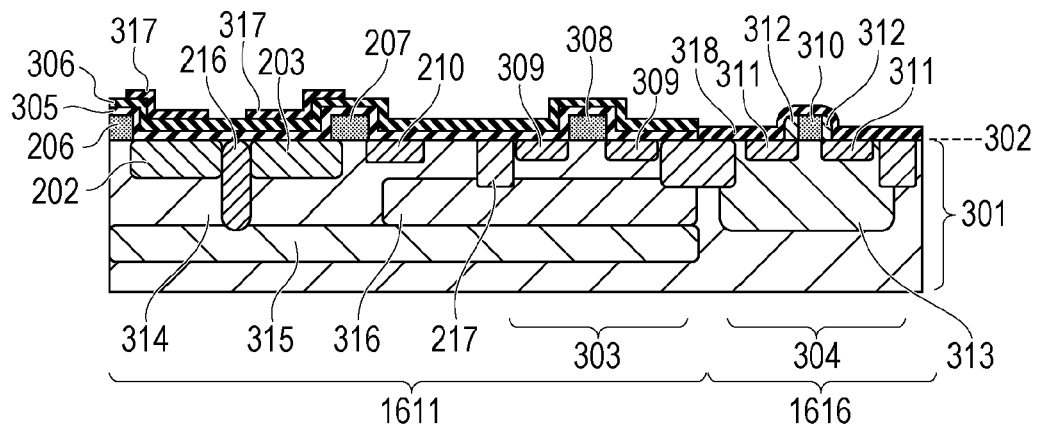
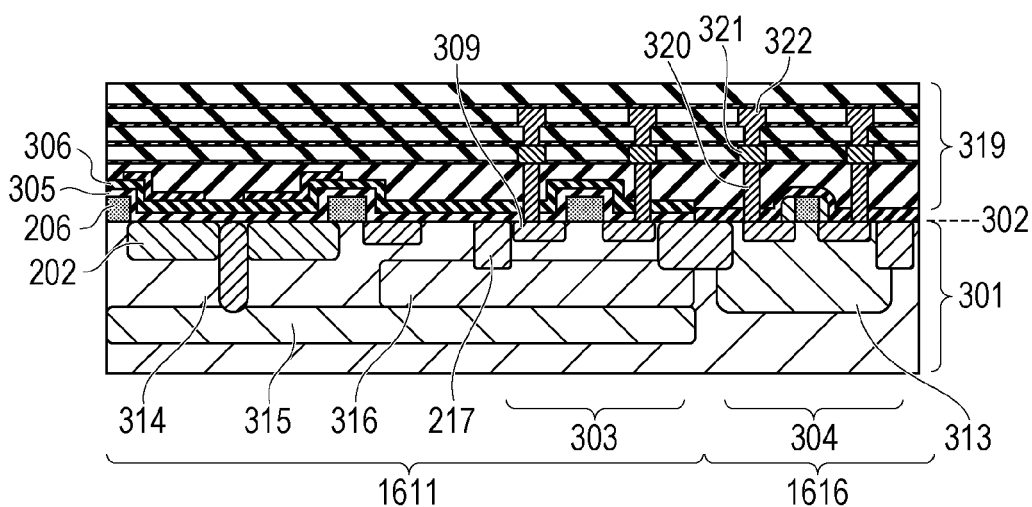

SOLID-STATE IMAGE PICKUP DEVICE AND METHOD FOR MANUFACTURING SOLID-STATE IMAGE PICKUP DEVICE

BACKGROUND OF THE INVENTION

1. Field of the Invention

The present invention relates to a solid-state image pickup device and a method for manufacturing a solid-state image pickup device.

2. Description of the Related Art

Solid-state image pickup devices including waveguides to increase the amount of light incident on photoelectric conversion units have recently been reported. Japanese Patent Laid-Open No. 2010-103458 discloses a method for embedding a high-refractive-index film in an opening in an insulating film in order to form a waveguide. Specifically, the method includes, at an early stage, forming a film under conditions in which a sputtering effect is high; and then forming a film under conditions in which a deposition effect is high.

Japanese Patent Laid-Open No. 2005-251804 discloses the inclination of side walls of waveguides to efficiently guide light to photoelectric conversion units. However, the inventors have found that the opening of the insulating film is likely to be clogged in forming a high-refractive-index member under conditions described in Japanese Patent Laid-Open No. 2010-103458 and that it is thus difficult to embed the high-refractive-index member without forming a void.

The inventors have found that the embedded high-refractive-index member is poorly bonded to a surrounding interlayer insulating film and thus can be detached therefrom and that an internal stress generated in the high-refractive-index member embedded can cause deformation of a wafer. Furthermore, the inventors have found that also in the structure described in Japanese Patent Laid-Open No. 2005-251804, it is difficult to embed a high-refractive-index member without forming a void when pixels are reduced in size.

According to aspects of the present invention, at least one of the foregoing problems is solved.

SUMMARY OF THE INVENTION

According to an aspect of the present invention, a method for manufacturing a solid-state image pickup device that includes a substrate including a photoelectric conversion unit and a waveguide arranged on the substrate, the waveguide corresponding to the photoelectric conversion unit and including a core and a cladding, includes a first step and a second step, in which in the first step and the second step, a member to be formed into the core is formed in an opening in the cladding by high-density plasma-enhanced chemical vapor deposition, and in which after the first step, in the second step, the member to be formed into the core is formed by the high-density plasma-enhanced chemical vapor deposition under conditions in which the ratio of a radio-frequency power on the back face side of the substrate to a radio-frequency power on the front face side of the substrate is higher than that in the first step.

According to another aspect of the present invention, a solid-state image pickup device includes a substrate including a photoelectric conversion unit and a waveguide arranged on the substrate, the waveguide corresponding to the photoelectric conversion unit and including a core and a cladding, in which the core comprises silicon nitride containing Si—H bonds and N—H bonds, and in which the silicon nitride has a ratio of the N—H bonds to the Si—H bonds, i.e., N—H bonds/Si—H bonds, of 1.0 to 10.

According to another aspect of the present invention, a method for manufacturing a solid-state image pickup device that includes a substrate including a photoelectric conversion unit and a waveguide arranged on the substrate, the waveguide corresponding to the photoelectric conversion unit and including a core and a cladding, includes a step of filling an opening in the cladding with the core by high-density plasma-enhanced chemical vapor deposition, in which in the high-density plasma-enhanced chemical vapor deposition, the deposition rate from a bottom face of the opening in a direction perpendicular to a main face of the substrate is 1.5 to 10 times the deposition rate from a side face of the opening in a direction parallel to the main face of the substrate.

According to another aspect of the present invention, a solid-state image pickup device includes a substrate including a photoelectric conversion unit and a waveguide arranged on the substrate, the waveguide corresponding to the photoelectric conversion unit and including a core and a cladding, in which the core has a bottom face with a width of $L1$, an upper face with a width of $L2$, and a side face with an angle of inclination of $\alpha$ to a main face of the substrate, the upper face having a height above the bottom face of $H$, and in which the core satisfies $L1<L2$, $H/L2 \leq 2$, and $72.8° < \alpha < 90°$.

According to another aspect of the present invention, a method for manufacturing a solid-state image pickup device that includes a substrate including a photoelectric conversion unit and a waveguide arranged on the substrate, the waveguide corresponding to the photoelectric conversion unit and including a core and a cladding, includes a first step and a second step, in which in the first step and the second step, a member to be formed into the core is formed in an opening in the cladding by high-density plasma-enhanced chemical vapor deposition, and in which in the second step, the member to be formed into the core is formed under conditions in which the ratio of the sputtering effect to the deposition effect is high compared with the first step.

Further features of the present invention will become apparent from the following description of exemplary embodiments with reference to the attached drawings.

BRIEF DESCRIPTION OF THE DRAWINGS

FIG. 3A, FIG. 3B, and FIG. 3C illustrate a method for manufacturing the solid-state image pickup device according to the first embodiment.

DESCRIPTION OF THE EMBODIMENTS

One disclosed aspect of the present invention relates to a method for manufacturing a solid-state image pickup device that includes a substrate including a photoelectric conversion unit and a waveguide arranged on the substrate, the waveguide corresponding to the photoelectric conversion unit and including a core and a cladding. The method includes a first step and a second step, in which the core is formed in an opening in the cladding by high-density plasma-enhanced chemical vapor deposition (high-density plasma-enhanced CVD). After the first step, in the second step, a member to be formed into the core is formed by the high-density plasma-enhanced CVD under conditions in which the ratio of a radio-frequency power on the back face side of the substrate to a radio-frequency power on the front face side of the substrate is higher than that in the first step.

The structure may provide the solid-state image pickup device in which an embedded high-refractive-index member has high adhesion and thus is less likely to be detached. It is possible to embed the high-refractive-index member without forming a void. Furthermore, it is possible to inhibit the deformation of a wafer due to the internal stress generated in the high-refractive-index member.

The term "opening" used here includes the cases where an opening passes through an insulating film and where an opening do not pass therethrough (depression), and may also be referred to as a "hole". As a structure including the opening, a structure including a waveguide is described in embodiments. Another structure may also be used. In embodiments described below, a solid-state image pickup device including the structure is exemplified. Common semiconductor devices may also have the structure. In the following description, a method for manufacturing a structure that may be produced by a common technique for producing a semiconductor, and details of the structure may be omitted. Hereinafter, descriptions will be given in detail with reference to the attached drawings.

First Embodiment

In this embodiment, a solid-state image pickup device is exemplified as a semiconductor device. A method for manufacturing a solid-state image pickup device will be described with reference to FIGS. 1 to 5B and 14. First, a solid-state image pickup device according to this embodiment will be described below with reference to FIGS. 1, 2, and 14.

Figure 1:
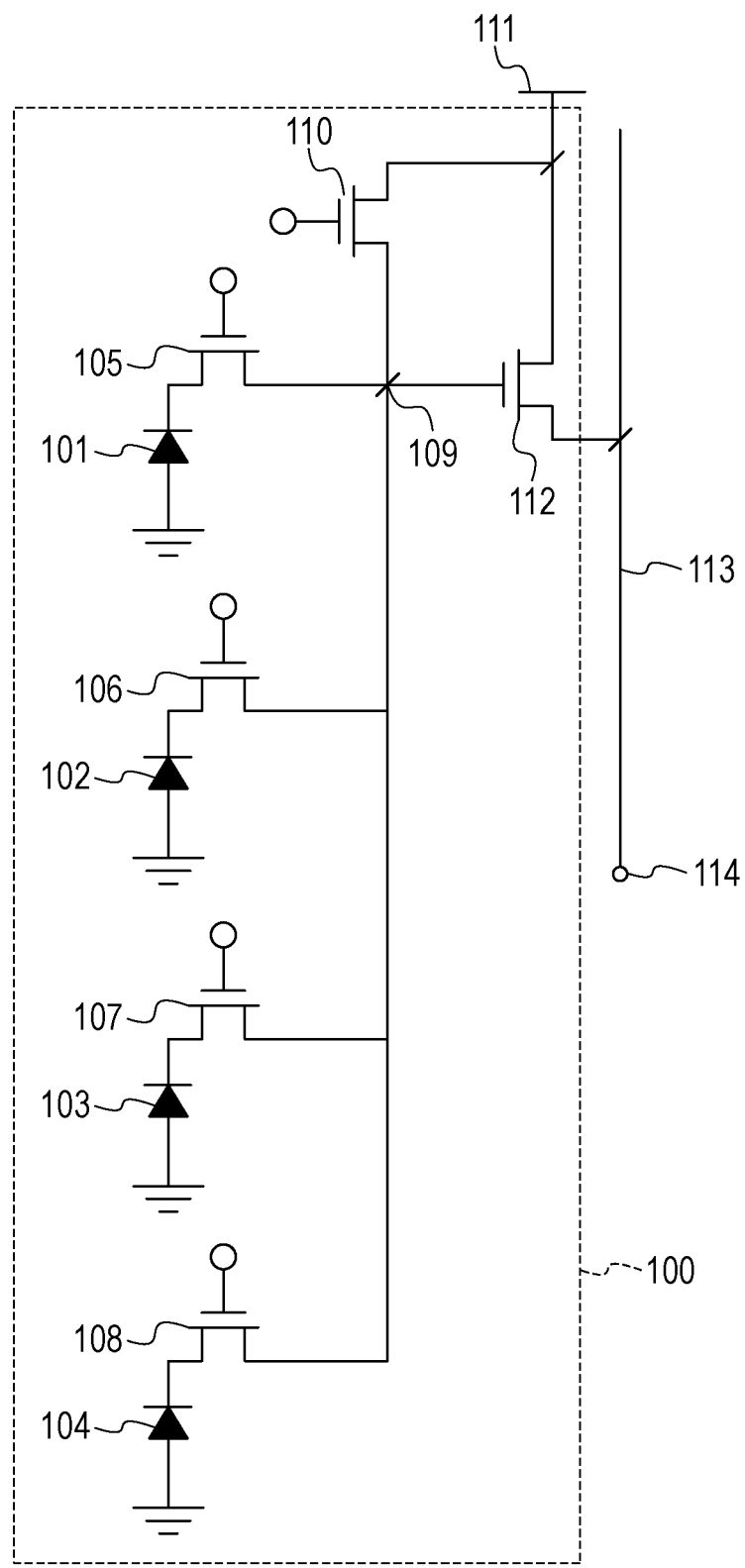
FIG. 1 is a circuit diagram illustrating a pixel cell of a solid-state image pickup device according to a first embodiment.
Figure 2:
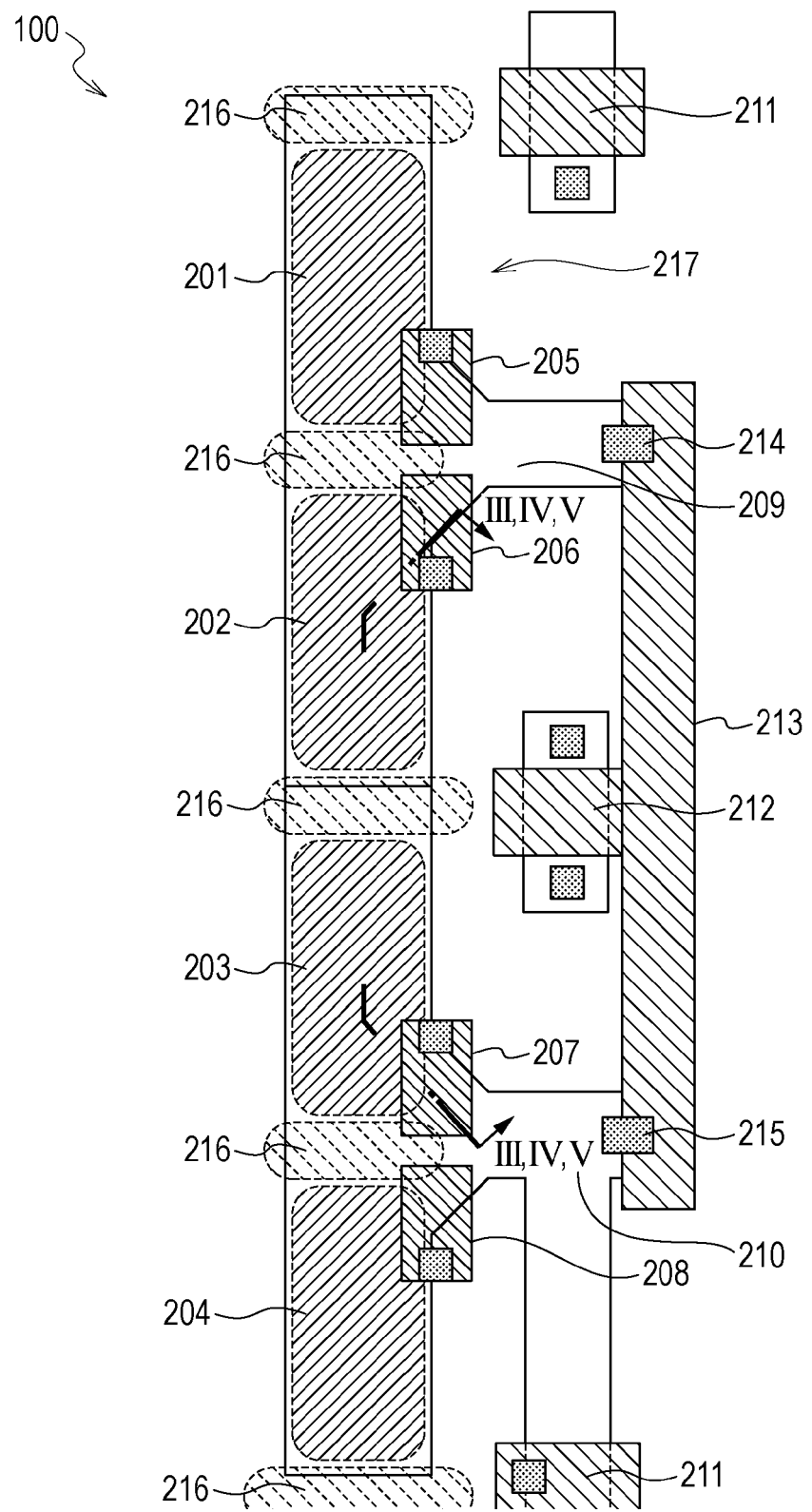
FIG. 2 is a planar layout of the pixel cell of the solid-state image pickup device according to the first embodiment.
Figure 14:
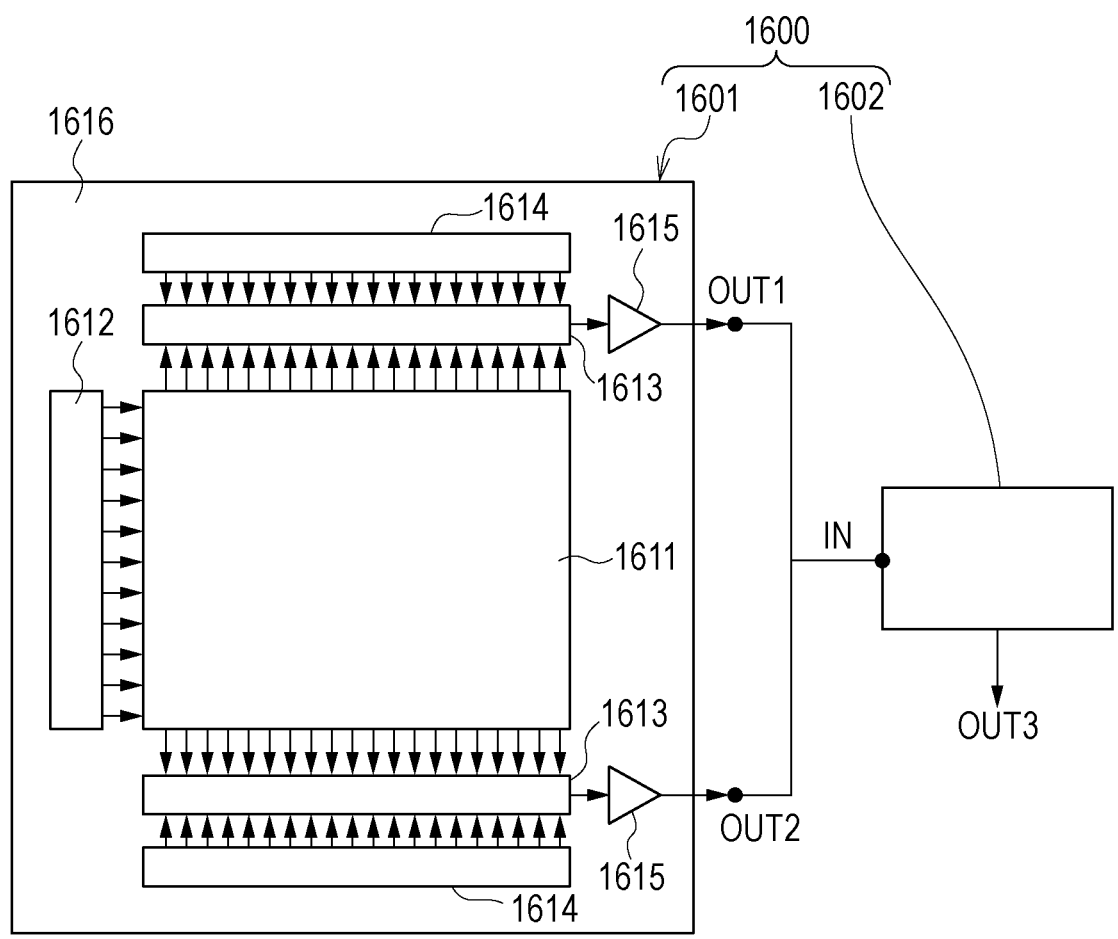
FIG. 14 is a schematic view of a solid-state image pickup device and an image pickup system.

FIG. 1 is a circuit diagram illustrating a pixel cell of a solid-state image pickup device according to this embodiment. FIG. 2 is a top view of the pixel cell. FIG. 14 is a block diagram illustrating an image pickup system including the solid-state image pickup device according to aspects of the present invention. In FIG. 1, a pixel cell 100 includes four photodiodes (hereinafter, referred to as "PDs") 101 to 104, four transfer transistor 105 to 108, a reset transistor 110, an amplifying transistor 112, and a floating diffusion node (hereinafter, referred to as an "FD node") 109.

The four PDs 101 to 104 photoelectrically convert incident light into electric charges corresponding to the quantity of incident light. The four transfer transistors 105 to 108 function as transfer units configured to transfer electric charges generated in the four respective PDs 101 to 104 into the FD node 109. Specifically, the first transfer transistor 105 transfers electric charges generated in the first PD 101. The second transfer transistor 106 transfers electric charges generated in the second PD 102. The third transfer transistor 107 transfers electric charges generated in the third PD 103. The fourth transfer transistor 108 transfers electric charges generated in the fourth PD 104. The FD node 109 is shared among a plurality of photoelectric conversion units. With respect to the amplifying transistor 112, a gate is electrically connected to the FD node 109. A drain is supplied with a predetermined voltage from a power supply line 111. A source is electrically connected to an output signal line 113. A signal based on the potential of the FD node 109 is fed to the output signal line 113. The reset transistor 110 resets the potential of the FD node 109 to any potential. Simultaneous establishment of electrical connection between the reset transistor 110 and any of the transfer transistors 105 to 108 allows the potential of a corresponding one of the PDs 101 to 104 to be reset. The power supply line 111 is configured to supply at least two potentials. Setting the potential of the FD node 109 to two values makes it possible to selectively feed a signal to the output signal line 113. A terminal 114 is connected to a readout circuit described below.

In the case where a pixel is defined as a repeat unit including at least one photoelectric conversion unit, the pixel cell 100 includes four pixels in FIG. 1. The pixel cell 100 may include, for example, a selective transistor and a capacity. While the photodiodes are exemplified as photoelectric conversion units, for example, photogates may be used.

In FIG. 14, a solid-state image pickup device 1601 includes a pixel unit 1611, a vertical scanning circuit 1612, two readout circuits 1613, two horizontal scanning circuits 1614, and two output amplifiers 1615. A region other than the pixel unit 1611 is referred to as a peripheral circuit portion 1616.

In the pixel unit 1611, a plurality of pixel cells illustrated in FIG. 1 are two-dimensionally arranged. That is, in the pixel unit 1611, the pixels are two-dimensionally arranged. Each of the readout circuits 1613 includes, for example, a column amplifier, a correlated double sampling (CDS) circuit, and an adding circuit. Each readout circuit 1613 reads signals from pixels in a row selected by the vertical scanning circuit 1612 through vertical signal lines and, for example, amplifies and adds the signals. For example, the column amplifier, the CDS circuit, the adding circuit, and so forth are arranged for each pixel column or for a plurality of pixel columns. The horizontal scanning circuits 1614 generate signals used to selectively read signals from the readout circuits 1613. The output amplifiers 1615 amplify and output signals from columns selected by the horizontal scanning circuits 1614. The structure described above is merely a structural example of the solid-state image pickup device. This embodiment is not limited to the structure. For example, In FIG. 14, each readout circuit 1613, each horizontal scanning circuit 1614, and each output amplifier 1615 are arranged in a corresponding one of regions located above and below the pixel unit 1611 in order to configure two output paths. Alternatively, three or more output paths may be arranged.

Referring to FIG. 2, a planar layout corresponding to FIG. 1 will be described below. In FIG. 2, charge accumulation regions (N-type semiconductor regions) 201 to 204, which are parts of the respective first to fourth PDs, are arranged. The charge accumulation regions 201 to 204 are referred to as "first to fourth PDs 201 to 204". Gate electrodes 205 to 208 of the first to fourth transfer transistors corresponding to the first to fourth PDs 201 to 204 are arranged. A first FD region 209 and a second FD region 210 are each arranged as a region corresponding to the FD node illustrated in FIG. 1. The first FD region 209 and the second FD region 210 are arranged in different active regions. Charges from the first and second PDs are transferred to the first FD region 209. Charges from the third and fourth PDs are transferred to the second FD region 210. The first FD region 209, the second FD region 210, and a gate electrode 212 of the amplifying transistor are electrically connected through a connecting line 213. The connecting line 213 may be formed by the extension of a polysilicon component constituting the gate electrode of the amplifying transistor. The first FD region 209 and the connecting line 213 are connected with a shared contact 214. The second FD region 210 and the connecting line 213 are connected with a shared contact 215. The term "shared contact" indicates a contact plug that connects semiconductor regions, a semiconductor region and a gate electrode, or gate electrodes, without using a wiring layer. In FIG. 2, the second FD region 210 is arranged in an active region common to the source or drain of the reset transistor. Reference numeral 211 denotes the gate electrode of the reset transistor.

Here, regions where the PDs and the sources, drains, and portions functioning as channels of the transistors are arranged are active regions. Other regions are element isolation regions 217. Potential barriers 216 composed of semiconductor regions that are effective against signal carriers are arranged between adjacent PDs and between adjacent gate electrodes in the active regions. The potential barriers 216 serve as element isolation regions that inhibit the transfer of charge carriers between adjacent PDs. In the case where the potential barriers are composed of P-type semiconductor regions, the potential barriers are effective against electrons. In the case where the potential barriers are composed of N-type semiconductor regions, the potential barriers are effective against holes.

A method for manufacturing such a solid-state image pickup device will be described with reference to FIGS. 3A to 5B. FIGS. 3A to 5B are schematic cross-sectional views taken along line III-III, IV-IV, and V-V in FIG. 2. Specifically, FIGS. 3A to 5B are cross-sectional views of the second and third PDs in the pixel cell, any transistor 303 in the pixel cell, and any transistor 304 in the peripheral circuit portion taken along line III-III, IV-IV, and V-V in FIG. 2. The foregoing components are designated using the same reference numerals, and descriptions are not redundantly repeated. Furthermore, detailed descriptions of steps that can be performed by common semiconductor techniques are omitted.

Referring to FIG. 3A, a step of preparing a semiconductor substrate including elements will be described below. A semiconductor substrate 301 prepared is composed of silicon and has a main face (surface) 302. The semiconductor substrate 301 includes two N-type semiconductor regions 202 and 203 of the PDs, the transistor 303 in the pixel cell, and the transistor 304 in the peripheral circuit portion. Electrons are collected in the N-type semiconductor regions 202 and 203. Hereinafter, the N-type semiconductor regions 202 and 203 are referred to as "charge accumulation regions 202 and 203" for convenience. In FIG. 3A, the transistor 303 in the pixel unit has N-type source and drain regions 309 and a gate electrode 308. An N-type semiconductor region 314 is arranged below the charge accumulation regions 202 and 203. The N-type semiconductor region 314 has a lower impurity concentration than the charge accumulation regions and partially constitutes the photoelectric conversion unit together with the charge accumulation regions. A P-type semiconductor region 315 serving partly as the photoelectric conversion unit is arranged below the N-type semiconductor region 314. A P-type semiconductor region 316 is arranged below the source and drain regions 309 of the transistor 303 and the second FD region 210. As the transistor 304 in the peripheral circuit portion, transistors constituting a CMOS circuit are arranged. In this embodiment, however, only an N-type transistor is illustrated. The transistor 304 in the peripheral circuit portion has N-type source and drain regions 311 arranged in a P-type semiconductor region 313 and has a gate electrode 310 arranged on the main face 302 of the semiconductor substrate between the source and drain regions. The semiconductor substrate 301 including these elements is prepared. Note that in each of the drawings, gate insulating films are not illustrated.

FIG. 3A illustrates a step of forming insulating films on the elements arranged on the semiconductor substrate. In the pixel unit 1611, an insulating film (not illustrated) composed of silicon oxide, an insulating film 305 composed of silicon nitride, and an insulating film 306 composed of silicon oxide are stacked in that order from the main face 302 side. These films may be formed by plasma-enhanced chemical vapor deposition (hereinafter, referred to as "CVD").

The transistor 304 has a side spacer 312 on the side wall of the gate electrode 310. The source and drain regions 311 have a lightly doped drain (LDD) structure (not illustrated). The side spacer 312 has a laminated structure including a silicon oxide film, a silicon nitride film, and a silicon oxide film. These films may be formed by plasma-enhanced CVD. These films constituting the side spacer 312 may be the same as the insulating film (not illustrated), the insulating film 305, and the insulating film 306 formed in the pixel unit 1611.

In FIG. 3A, an insulating film 307 composed of silicon nitride is formed over the pixel unit 1611 and the peripheral circuit portion 1616 by, for example, low-pressure plasma-enhanced CVD (LP-CVD). Here, before the formation of the insulating film 307, a film (not illustrated) composed of silicon oxide may be formed over the pixel unit 1611 and the peripheral circuit portion 1616 by plasma-enhanced CVD. This is because the formation of the film prevents exposure of the main face 302 of the semiconductor substrate in the source and drain regions 311 of the transistor 304 in the peripheral circuit portion.

Referring to FIG. 3B, the insulating film 307 formed over the pixel unit 1611 and the peripheral circuit portion 1616 is processed by common lithography and etching techniques into a desired pattern to form insulating films 317 and an insulating film 318. The insulating films 317 extend from portions above the charge accumulation regions 202 and 203, i.e., above the photoelectric conversion unit, to portions above parts of the gate electrodes of the transfer transistors. In another region of the pixel unit 1611, the insulating film 307 illustrated in FIG. 3A is removed by etching. In the peripheral circuit portion 1616, the insulating film 307 illustrated in FIG. 3A is not etched away and is formed into the insulating film 318.

Referring to FIG. 3C, a plurality of interlayer insulating films 319, contact plugs 320, a first wiring layer 321, a second wiring layer 322 including via plugs are formed on the structure illustrated in FIG. 3B. Here, plural contacts and plural lines of the wiring layers are arranged. In the plural interlayer insulating films 319, insulating films composed of silicon oxide and insulating films composed of silicon nitride are alternately stacked. Each of the insulating films composed of silicon oxide is formed by plasma-enhanced CVD so as to have a thickness of 120 nm to 1000 nm. Each of the insulating films composed of silicon nitride is formed by plasma-enhanced CVD so as to have a thickness of 10 nm to 200 nm. Thus, most of the plural interlayer insulating films 319 are composed of silicon oxide. The plural insulating films composed of silicon nitride function as etch stop films at the time of the formation of the wiring layers and the via plugs and as diffusion preventing films configured to prevent diffusion of metals constituting the wiring layers. The plural interlayer insulating films 319 will serve as claddings of waveguides to be formed.

The contact plugs 320 are mainly composed of tungsten. The first wiring layer 321 and the second wiring layer 322 formed integrally with the via plugs are mainly composed of copper. The first wiring layer 321 is formed by a single damascene process. The second wiring layer 322 is formed by a dual damascene process. The contact plugs, the via plugs, and conductive patterns of the wiring layers each include a barrier metal. The first and second wiring layers may be composed of aluminum and formed by patterning instead of the damascene processes.

In FIG. 3C, among the plural insulating films composed of silicon nitride, the insulating films in contact with the upper faces of the first and second wiring layers function as diffusion preventing films configured to prevent diffusion of a metal, i.e., copper. The insulating films arranged on the lower faces of the first and second wiring layers function as etch stop films when the first and second wiring layers are formed by the damascene processes. The thickness of the insulating films functioning as the etch stop films is smaller than that of the insulating films functioning as the diffusion preventing films. In the damascene processes, a step of forming a groove for a line or a groove for a line and a via plug is performed. When the groove is formed by etching, the etch stop film may be arranged to control the shape of the groove. Thus, the insulating films functioning as the etch stop films are arranged on the lower faces of the first and second wiring layers. The etch stop films are removed in forming the grooves. Hence, the lower faces of the etch stop films are flush with or above the lower faces of the first and second wiring layers. Alternatively, a wafer in which the structure illustrated in FIG. 3C has been formed is obtained, and then the subsequent step of forming an opening may be performed.

Figure 4A:
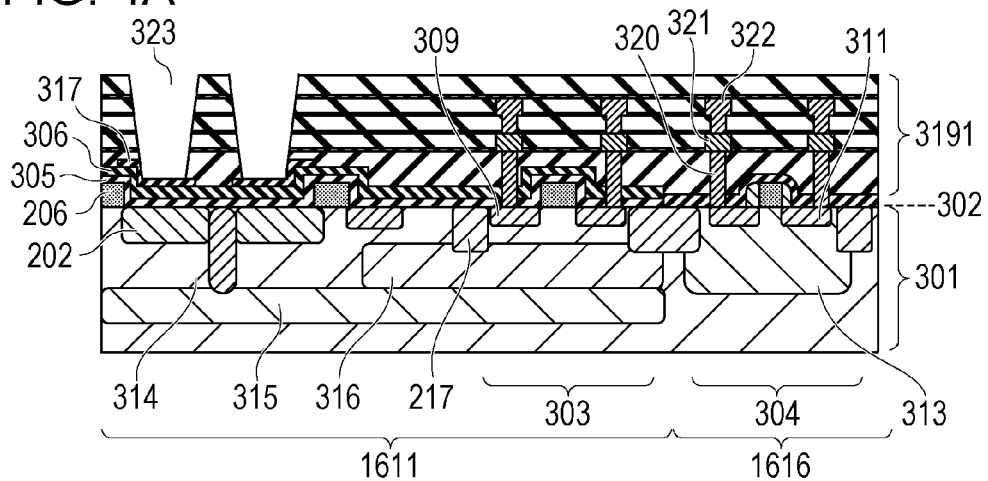
FIG. 4A, FIG. 4B, and FIG. 4C illustrate the method for manufacturing the solid-state image pickup device according to the first embodiment.

Next, openings 323 are formed in the plural interlayer insulating films 319 illustrated in FIG. 3C, thereby forming a structure illustrated in FIG. 4A. A photoresist pattern (not illustrated) having openings in regions corresponding to the photoelectric conversion unit is formed on the plural interlayer insulating films 319. Etching is performed with the photoresist pattern as a mask. For example, anisotropic etching is performed as the etching. Specifically, the plural interlayer insulating films are subjected to plasma etching treatment until the insulating films 317 are exposed. The insulating films 317 reduce plasma damage to the photoelectric conversion unit during etching and also function as etch stop films. The insulating film (not illustrated) composed of silicon oxide and the insulating films 305 and 306 arranged between the insulating films 317 and the main face 302 of the semiconductor substrate function as antireflection coating films for light incident on the photoelectric conversion unit.

The openings 323 illustrated in FIG. 4A is filled with a transparent material having a higher refractive index than the plural interlayer insulating films 3191 serving as claddings, thereby forming portions to be formed into cores of waveguides. Here, silicon nitride having a higher refractive index than silicon oxide that mainly constitutes the plural interlayer insulating films 3191 is deposited in the openings. Specifically, silicon nitride is deposited by high-density plasma-enhanced CVD (hereinafter, referred to as "HDP-CVD") on the entire face of the substrate to fill the openings 323 with silicon nitride. The HDP-CVD is performed with a high-density plasma-enhanced CVD apparatus illustrated in FIG. 13. An unnecessary portion of the resulting silicon nitride film formed on, for example, a portion on the plural interlayer insulating films 3191 other than the openings 323 is removed by chemical mechanical polishing (hereinafter, referred to as "CMP") or plasma etching. This step planarizes the surface of the silicon nitride film. Thereby, high-refractive-index members 324 are formed in the openings 323 through these steps. Waveguides include the plural interlayer insulating films 3191 and the high-refractive-index members 324. Here, in this embodiment, CMP is performed to remove and planarize the silicon nitride film. Part of the silicon nitride film on the plural interlayer insulating films 3191 is left, thus forming an insulating film 325 over the high-refractive-index members 324 and the upper face of the plural interlayer insulating films 3191, the insulating film 325 having a thickness of about 100 nm to about 500 nm. The presence of the silicon nitride film reduces plasma damage to the wiring layers. An insulating film 326 composed of silicon oxynitride is formed on the surface of the insulating film 325. The insulating film 326 is formed by plasma-enhanced CVD so as to have a thickness of about 50 nm to about 150 nm.

Figure 4B:
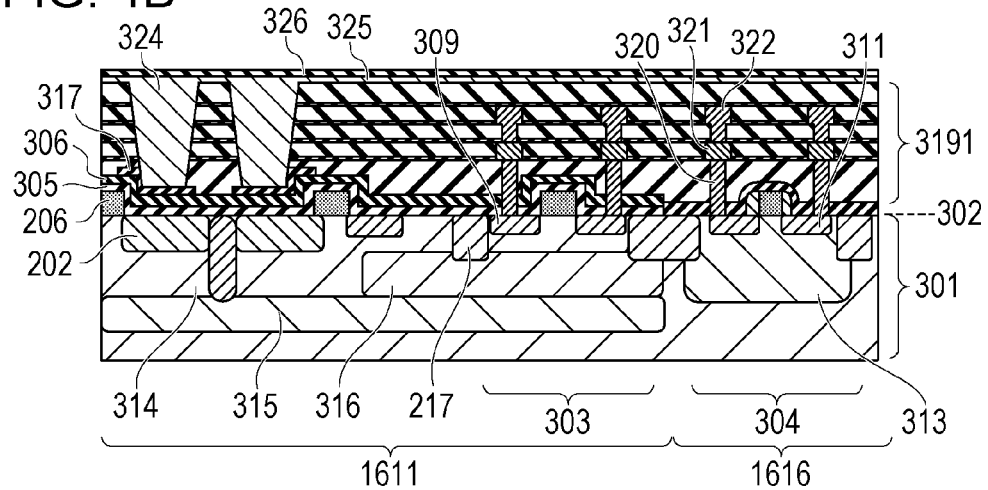

After the step illustrated in FIG. 4B, desired regions of the insulating films 325 and 326 are removed. In this embodiment, all portions of the insulating films 325 and 326 arranged in a region corresponding to the peripheral circuit portion are removed to form an opening 329. However, at least a region where the via plugs are arranged may be removed by etching. The removal is performed by anisotropic etching, for example, plasma etching. This step forms the insulating films 325 and 326 into insulating films 327 and 328 having the opening 329. Subsequently, an insulating film 330 is formed so as to fill the opening 329 and cover the insulating films 327 and 328. The insulating film 330 is composed of, for example, silicon oxide and may be formed by plasma-enhanced CVD. A via plug 331 is formed so as to pass through the insulating film 330 and some of the plural interlayer insulating films 319 arranged on the second wiring layer 322. The via plug 331 is composed of, for example, tungsten and includes a barrier metal, for example, titanium or titanium nitride.

Figure 4C:
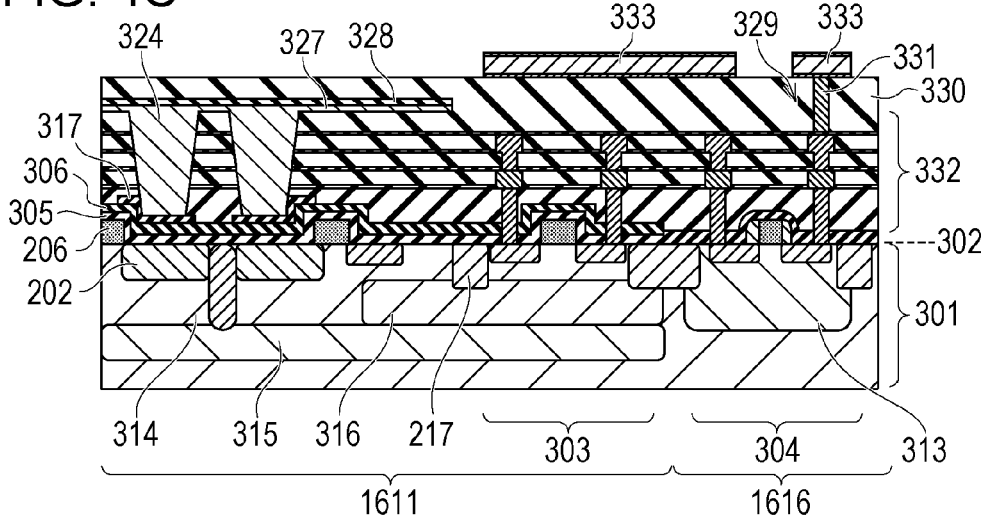

A third wiring layer 333 is formed on the via plug 331, providing a structure illustrated in FIG. 4C. The third wiring layer 333 is composed of an electric conductor mainly containing, for example, aluminum and is formed by patterning. Here, the third wiring layer 333 also functions as a light-shielding film for the peripheral circuit portion. In FIG. 4C, an insulating film to be formed into an insulating film 334 and an insulating film to be formed into an insulating film 335 are formed in that order. The insulating film to be formed into the insulating film 334 is composed of silicon oxynitride formed by plasma-enhanced CVD. The insulating film to be formed into the insulating film 335 is composed of silicon nitride formed by plasma-enhanced CVD. A lens-shaped photoresist is formed on the insulating film to be formed into the insulating film 335. Etching is performed with the photoresist as a mask to form lenses in the insulating film to be formed into the insulating film 335. An insulating film to be formed into an insulating film 336 is formed on the lenses. Removal of the three insulating films in a region corresponding to an input or output pad provides a structure illustrated in FIG. 5A. Here, the insulating film 335 serves as a lens layer including intralayer lenses 337. The insulating films 334 and 336 function as antireflection coatings for the insulating film 335.

Figure 5A:
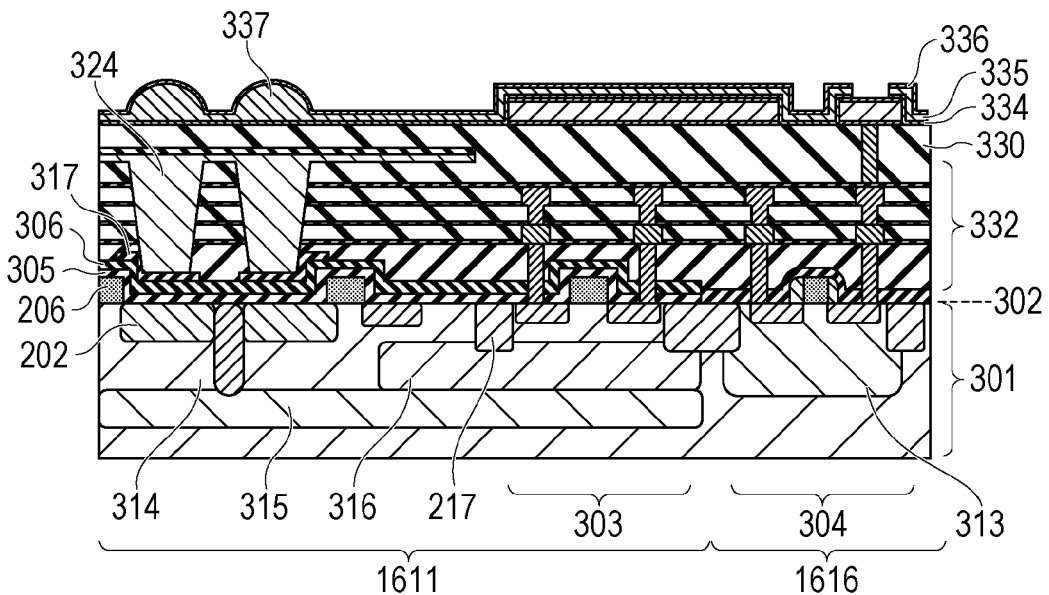
FIGS. 5A and 5B illustrate the method for manufacturing the solid-state image pickup device according to the first embodiment.
Figure 5B:
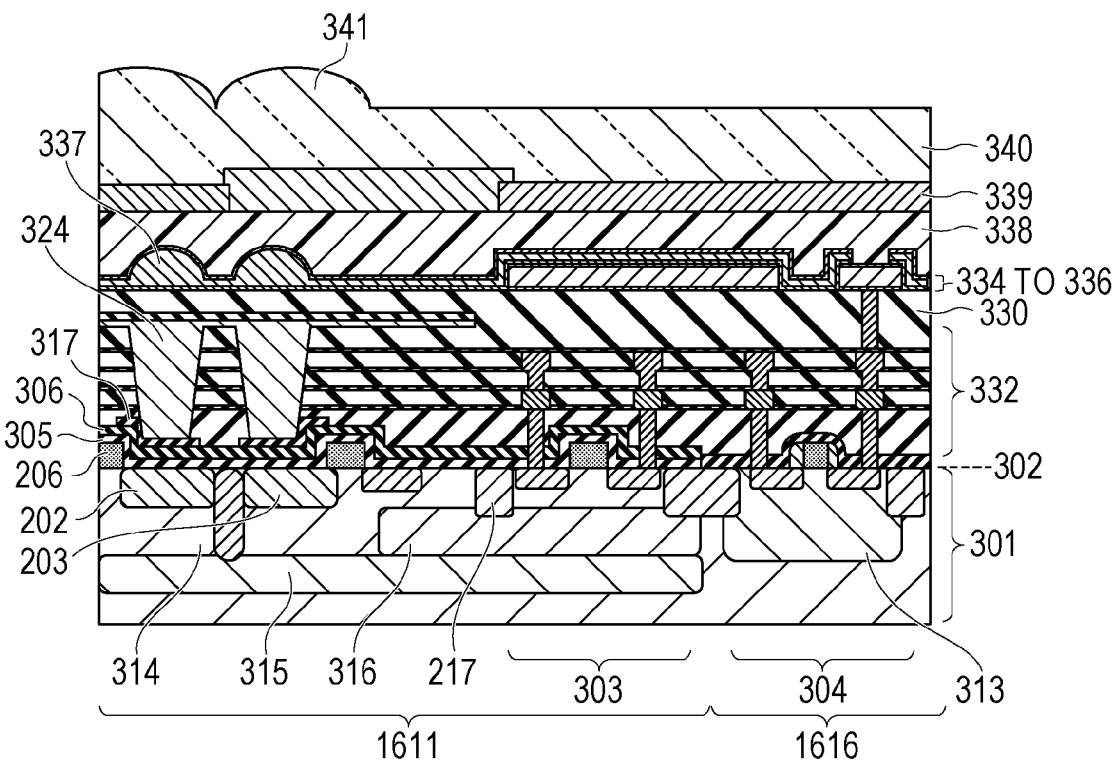

After the step illustrated in FIG. 5A, a planarizing layer 338 composed of a resin, a color filter layer 339 including a color filter corresponding to a plurality of colors, and a microlens layer 340 including microlenses 341 are formed in that order, providing a structure illustrated in FIG. 5B.

As described above, it is possible to produce a solid-state image pickup device by the procedure illustrated in FIGS. 3A to 5B. Note that FIGS. 3A to 5B illustrate a portion on the main face side of the semiconductor substrate 301.

In the method for manufacturing a solid-state image pickup device described above, the process of forming the high-refractive-index members 324 illustrated in FIG. 4B is a characteristic feature of this embodiment. This step will be described in detail below with reference to FIGS. 6A, 6B, and 13.

Figure 6A:
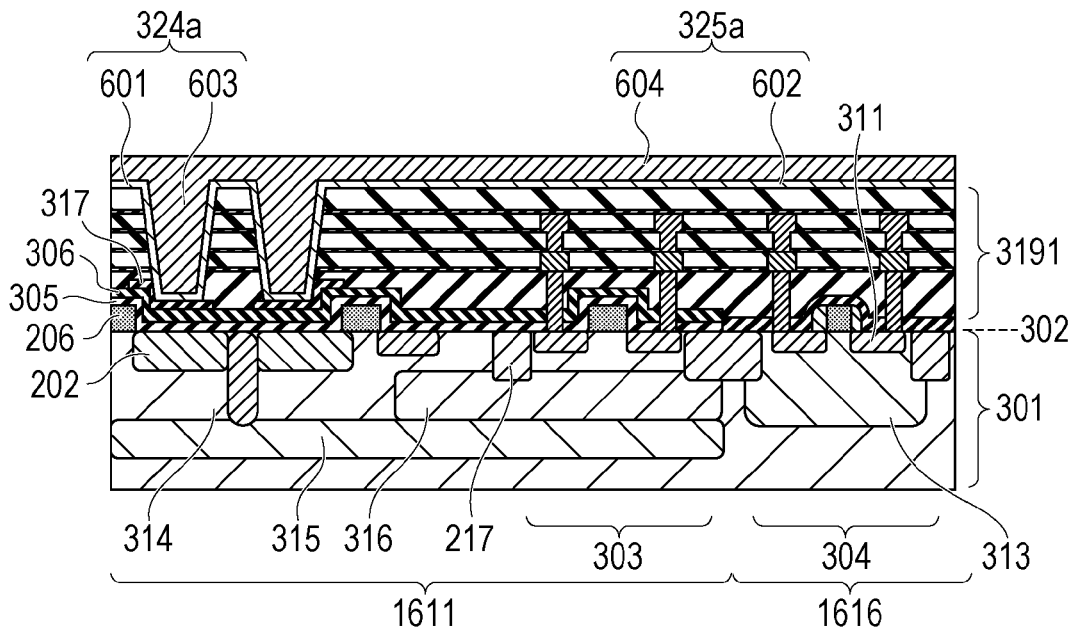
FIGS. 6A and 6B illustrate the method for manufacturing the solid-state image pickup device according to the first embodiment.
Figure 6B:
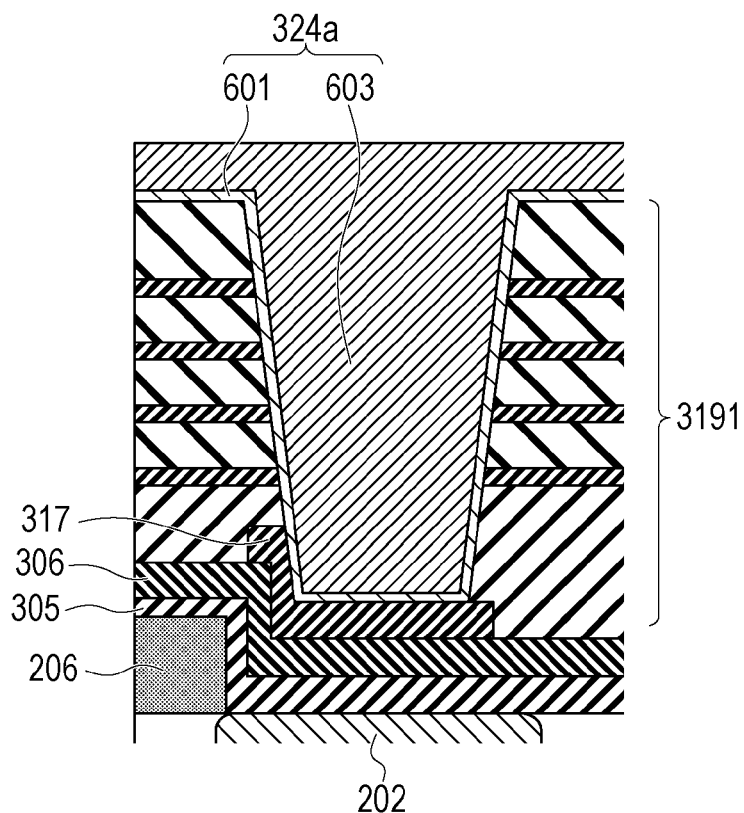

In this embodiment, the high-refractive-index members 324 are formed by the two-stage process. FIG. 6A is a schematic cross-sectional view of a solid-state image pickup device corresponding to FIG. 4B. FIG. 6B is an enlarged fragmentary schematic cross-sectional view of the structure illustrated in FIG. 6A. In FIGS. 6A and 6B, elements equal to elements in FIG. 4B are designated using the same reference numerals, and descriptions are not redundantly repeated. As illustrated in FIGS. 6A and 6B, the high-refractive-index members 324 and the insulating film 325 in FIG. 4B correspond to high-refractive-index members 324a and an insulating film 325a, respectively, in FIGS. 6A and 6B. The high-refractive-index members 324a and the insulating film 325a are each formed of two members. In FIGS. 6A and 6B, a first member 601 and an insulating film 602 are formed along side walls of the openings 323 illustrated in FIG. 4A and cover the plural interlayer insulating films 3191. A second member 603 and an insulating film 604 cover the first member 601 and the insulating film 602. Each of the high-refractive-index members 324a includes the first member 601 and the second member 603. The insulating film 325a corresponding to the insulating film 325 illustrated in FIG. 4A includes the insulating film 602 and the insulating film 604. A method for forming the high-refractive-index members 324a will be described in detail below with reference to FIG. 6B.

Figure 13:
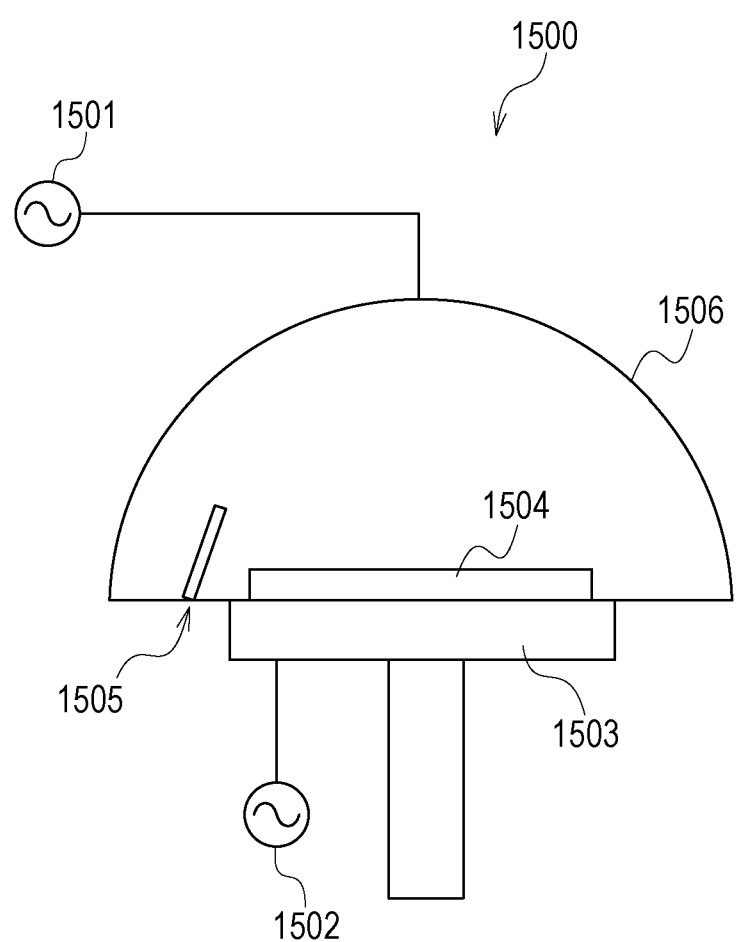
FIG. 13 is a schematic view illustrating a high-density plasma-enhanced chemical vapor deposition apparatus.

A high-density plasma-enhanced CVD apparatus to form the high-refractive-index members 324a will be described with reference to FIG. 13. The high-density plasma-enhanced CVD apparatus is one in which a gas is formed into a dense plasma using a radio-frequency field or a magnetic field to deposit a film. FIG. 13 is a schematic view illustrating a high-density plasma-enhanced CVD apparatus 1500 using a radio-frequency field. The high-density plasma-enhanced CVD apparatus 1500 includes a chamber 1506, a stage 1503 equipped with a temperature control mechanism, a radio-frequency power source 1501 connected to a first electrode, and a radio-frequency power source 1502 connected to the stage (second electrode). A semiconductor wafer 1504 is placed on the stage 1503. Radio-frequency powers of the upper radio-frequency power source 1501 and the lower radio-frequency power source 1502 may be individually set. When a film is formed, a desired gas is fed from a feed port 1505 and allowed to react. The high-density plasma-enhanced CVD is performed while a sputtering effect and a deposition effect are adjusted. By controlling the radio-frequency powers of the upper and lower radio-frequency power sources, the gas, the temperature of the wafer, and so forth, the ratio of the sputtering effect to the deposition effect is adjusted.

A method for forming the high-refractive-index members according to this embodiment includes a first step of forming the first member and a second step of forming the second member. The second step is performed under conditions in which the ratio of the sputtering effect to the deposition effect is higher than that in the first step. The term "deposition effect" used here indicates a state in which a film of a desired species is grown by CVD. The term "sputtering effect" indicates a state in which an underlying film is subjected to sputtering by bombardment with a plasma or a species.

The first member formed under the conditions has higher adhesion to the side walls and bottom faces of the openings 323 and the interlayer insulating films 3191 illustrated in FIG. 4A than the second member, thus inhibiting the detachment of the first member to form a high-refractive-index member. Furthermore, a stress generated in the second member is reduced, thus inhibiting the deformation of the wafer. In the high-density plasma-enhanced CVD, a member formed under conditions in which the deposition effect is high has a high density and high adhesion to an underlying film. That is, in the first step, the film having high adhesion to the underlying film is formed. Then in the second step, the high-refractive-index members are formed under conditions in which the openings are easily filled. Note that a film having high adhesion to an underlying film is highly likely to have a high stress. In the case where an opening is filled with such a film, the thickness of the film is increased, so that a wafer is likely to deform. In the method according to this embodiment, it is possible to reduce the detachment and inhibit the deformation of the wafer.

In the first step, a mixed gas that contains a silicon-containing gas, nitrogen, a nitrogen-containing gas, and an inert gas is fed, and a radio-frequency field is applied from the radio-frequency power source 1501. In the second step, a mixed gas that contains a silicon-containing gas, nitrogen, a nitrogen-containing gas, and an inert gas is fed, and radio-frequency fields are applied from the radio-frequency power sources 1501 and 1502.

Examples of the silicon-containing gas include silane, tetraethoxysilane (TEOS), trimethylsilane, and tetramethylsilane. An example of the nitrogen-containing gas is ammonia. Examples of the inert gas include argon and helium. In this embodiment, the mixed gas in each of the first and second steps includes silane, nitrogen, ammonia, and argon.

The radio-frequency power source 1501 supplies a radio frequency of 800 kHz at a radio-frequency power of 1000 to 7000 W. The radio-frequency power source 1502 supplies a radio frequency of 13.56 MHz at a radio-frequency power of 0 to 5000 W. According to this embodiment, in the first step, the radio-frequency power of the radio-frequency power source 1501 is 5000 W, and the radio-frequency power of the radio-frequency power source 1502 is 0 W. In the second step, the radio-frequency power of the radio-frequency power source 1501 is 5000 W, and the radio-frequency power of the radio-frequency power source 1502 is 3000 W. In the first step, the radio-frequency field is applied only to the semiconductor wafer 1504, i.e., only to the electrode adjacent to the front face of the semiconductor substrate. That is, in the first step, the ratio of the radio-frequency power applied to the electrode adjacent to the front face of the semiconductor substrate to the radio-frequency power applied to the electrode adjacent to the back face of the semiconductor substrate is high compared with the second step.

That is, the second step is performed under conditions in which the ratio of the sputtering effect to the deposition effect is high compared with the first step. The conditions are, for example, ones in which in the second step, the ratio of a radio-frequency power applied to the electrode adjacent to the back face of the semiconductor substrate to a radio-frequency power applied to the electrode adjacent to the front face of the semiconductor substrate is high compared with the first step. In other words, the ratio in the second step is higher than that in the first step. Furthermore, a high proportion of the inert gas is suitable for the conditions. In this case, an excessively high proportion of the inert gas leads to an excessively high sputtering effect. Thus, the insulating film, i.e., the underlying film, on the side walls of the openings 323 illustrated in FIG. 4A may be removed. Consequently, for example, the ratio of argon to silane in the second step may be in the range of 1.0 to 6.0.

Under the conditions described above, after the first step of forming the first member 601 in the openings 323 illustrated in FIG. 4A, the second step of forming the second member 603 is performed, thereby forming the high-refractive-index members 324a. Preferably, the first member may have a thickness of 10 nm to 50 nm. The reason for this is as follows: a thickness of the first member of larger than 10 nm will result in stronger adhesion, and a thickness less than 50 nm results in the deformation of the wafer due to the stress in the member.

As described above, it is possible to form the high-refractive-index members 324a that are less likely to be detached from the underlying film by the production method according to this embodiment. It is also possible to reduce the stress in the high-refractive-index members and thus reduce the deformation of the wafer.

The method may further include a third step of forming a third member between the first step and the second step. In the third step, the ratio of the sputtering effect to the deposition effect, for example, the ratio of a radio-frequency power applied to the electrode adjacent to the back face to a radio-frequency power applied to the electrode adjacent to the front face of the semiconductor substrate, is set under conditions intermediate between the conditions in the first step and the conditions in the second step. In this way, the step may be performed under the conditions intermediate between the conditions in the first step and the conditions in the second step, thereby continuously forming the high-refractive-index members. In the foregoing descriptions, the first member, the second member, and so forth are used for simplicity. Alternatively, an integrated member may be provided as a final structure. The cone angle of each opening 323 illustrated in FIG. 4A is not limited to the angle in this embodiment.

Second Embodiment

Figure 7A:
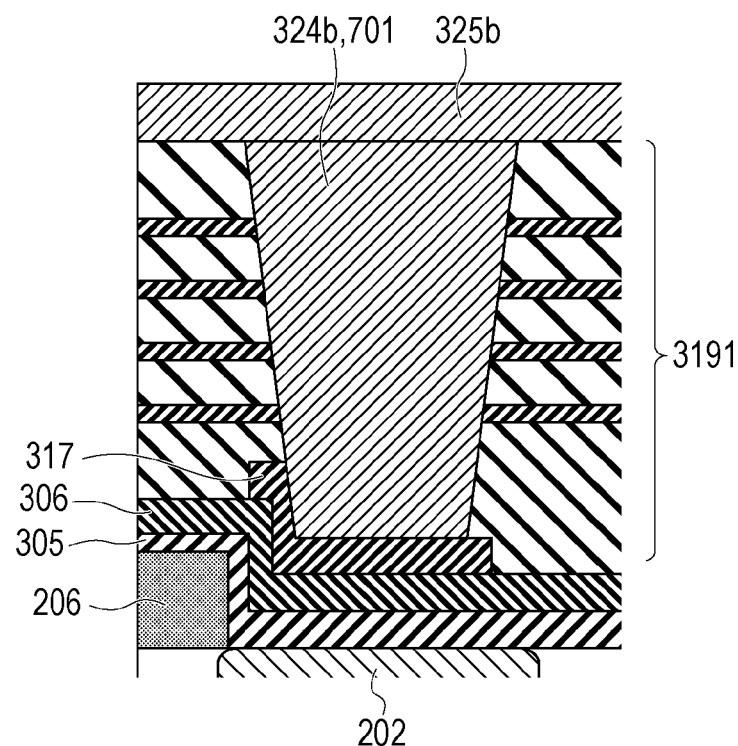
FIG. 7A is a schematic cross-sectional view of a solid-state image pickup device according to a second embodiment.

This embodiment is different from the first embodiment in that the high-refractive-index members 324 are formed in one step. The other portions of the structure and the production method are the same as those in the first embodiment. FIG. 7A corresponds to FIG. 6B and is an enlarged fragmentary schematic cross-sectional view of a solid-state image pickup device corresponding to that illustrated in FIG. 4B. As illustrated in FIG. 7A, a high-refractive-index member 324b is formed of a single member 701. In this embodiment, the member 701 is composed of a material having properties that exhibit a spectrum 702 depicted in FIG. 7B. The use of the material inhibits the formation of voids when the openings 323 illustrated in FIG. 4A are filled with a high-refractive-index material. A graph depicted in FIG. 7B will be described in detail below.

Figure 7B:
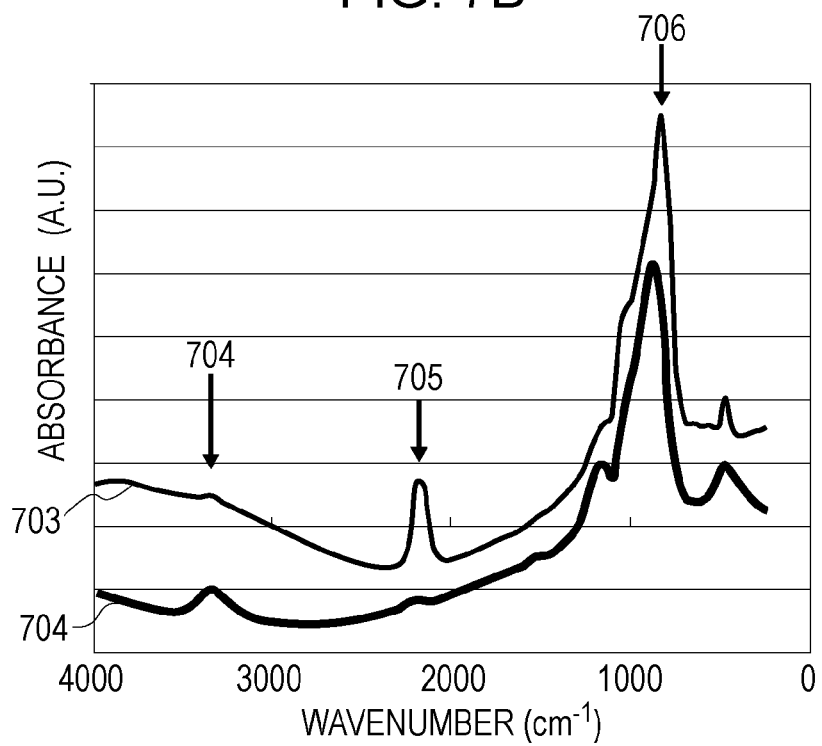
FIG. 7B is a graph illustrating the analytical results of the solid-state image pickup device according to the second embodiment.

FIG. 7B is a graph illustrating analytical results by Fourier transform infrared spectroscopy (hereinafter, referred to as "FT-IR"). The horizontal axis represents the wavenumber. The vertical axis represents the absorbance. In the graph, a peak 704 indicates the presence of N—H bonds. A peak 705 indicates the presence of Si—H bonds. A peak 706 indicates the presence of Si—N bonds. The spectrum 702 exhibits the analytical result of the member 701. A spectrum 703 exhibits the analytical result of a comparable member that causes the formation of a void in filling the openings 323 illustrated in FIG. 4A. Silicon nitride formed by plasma-enhanced CVD contains Si, H, and N. The spectrum 702 has the peak 704 that indicates N—H bonds and demonstrates that many N—H bonds are contained. The spectrum 703 demonstrates that the amount of the Si—H bonds is greater than that of the N—H bonds. To inhibit the formation of voids, the silicon nitride may have a ratio of the N—H bonds to the Si—H bonds, i.e., N—H bonds/Si—H bonds, of 1.0 to 10.

The member 701 is formed by high-density plasma-enhanced CVD under the conditions used in the second step according to the first embodiment. To increase the number of the N—H bonds, known conditions may be used in which a film containing a large number of N—H bonds is formed by common high-density plasma-enhanced CVD. For example, the conditions are used in which the ratio of the sputtering effect to the deposition effect is high in the second step according to the first embodiment. In addition, the proportion of nitrogen in the mixed gas described in the first embodiment may be increased. For example, the proportion of nitrogen is set to 1.2 to 2.0 times the silicon-containing gas, 2.0 to 4.0 times the nitrogen-containing gas, and 2.0 to 4.0 times the inert gas. In the case where the N—H bonds fall within the range described above, it is possible to fill the openings with the high-refractive-index member without forming a void. It is also possible to control the internal stress within an appropriate range and thus inhibit the deformation of the wafer. Hence, this embodiment may be suitable for the structure in which the insulating film 327 is arranged on the high-refractive-index members 324 as illustrated in FIG. 5B.

To improve the adhesion to the insulating films to be formed into claddings, the high-refractive-index members 324 may be formed by the two steps as in the first embodiment.

Third Embodiment

Figure 8A:
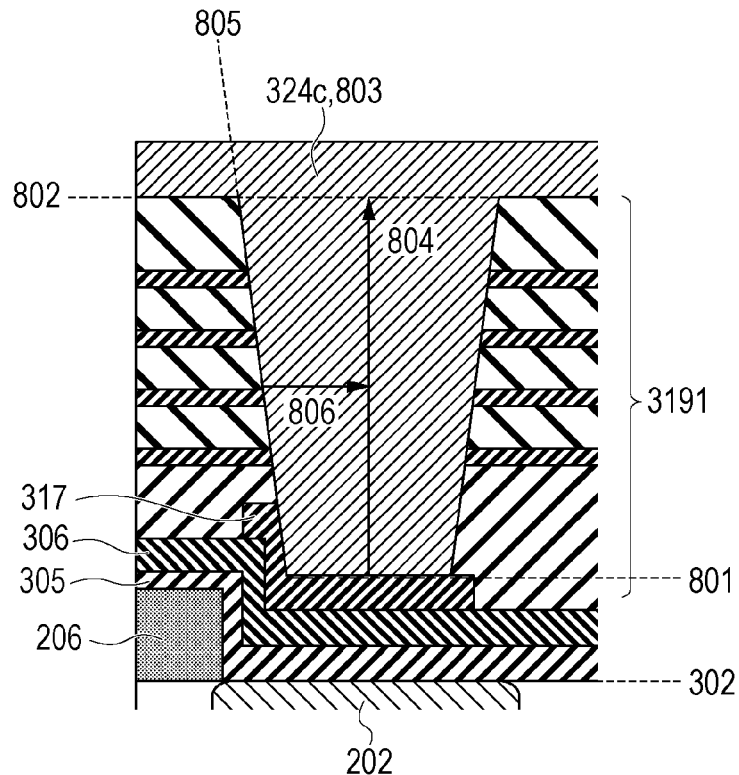
FIGS. 8A and 8B are schematic cross-sectional views of a solid-state image pickup device according to a third embodiment.

This embodiment is different from the first embodiment in that the high-refractive-index members 324 are formed in one step. The other portions of the structure and the production method are the same as those in the first embodiment. FIG. 8A corresponds to FIG. 6B and is an enlarged fragmentary schematic cross-sectional view of a solid-state image pickup device corresponding to that illustrated in FIG. 4B. As illustrated in FIG. 8A, a high-refractive-index member 324c is formed of a single member 803. In FIG. 8A, one of the openings 323, which are illustrated in FIG. 4A and are regions where the high-refractive-index members 324c are formed, has a bottom face 801, an upper plane 802 including the upper face of the plural interlayer insulating films 3191 in a region surrounding the openings 323 illustrated in FIG. 4A, and a side face 805. Here, a direction perpendicular to the bottom face 801 is defined as a direction 804. A direction parallel to the face 801 is defined as a direction 806. The bottom face 801 is parallel to the main face 302 of the substrate.

Figure 8B:
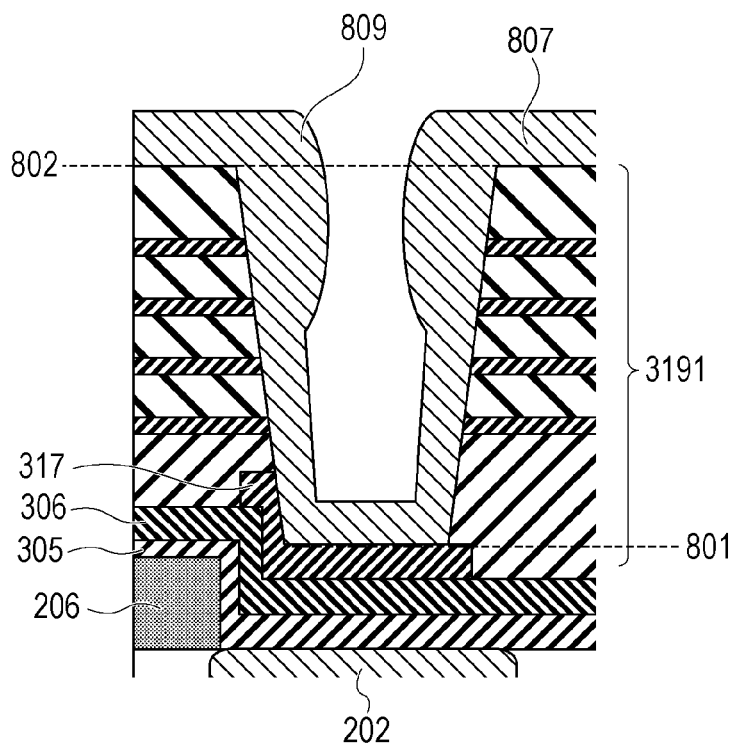

In this embodiment, a film to be formed into the member 803 is formed by high-density plasma-enhanced CVD to fill the corresponding opening 323 under conditions such that the deposition rate of the film to be formed into the member 803 satisfies the relationship described below. The conditions are such that the deposition rate from the bottom face 801 in the direction 804 is 1.5 to 10 times the deposition rate from the side face 805 in the direction 806. For example, the film is formed under the conditions used in the second step according to the first embodiment. Unlike a member 807 illustrated in FIG. 8B, a protruding portion 809 is not formed under the conditions. FIG. 8B illustrates a filling process under conditions in which a void is formed. In this case, the upper portion of the opening will be clogged with the protruding portion 809 to form a void. In the production method according to this embodiment, however, it is possible to form a waveguide while the formation of a void is inhibited.

Fourth Embodiment

Figure 9A:
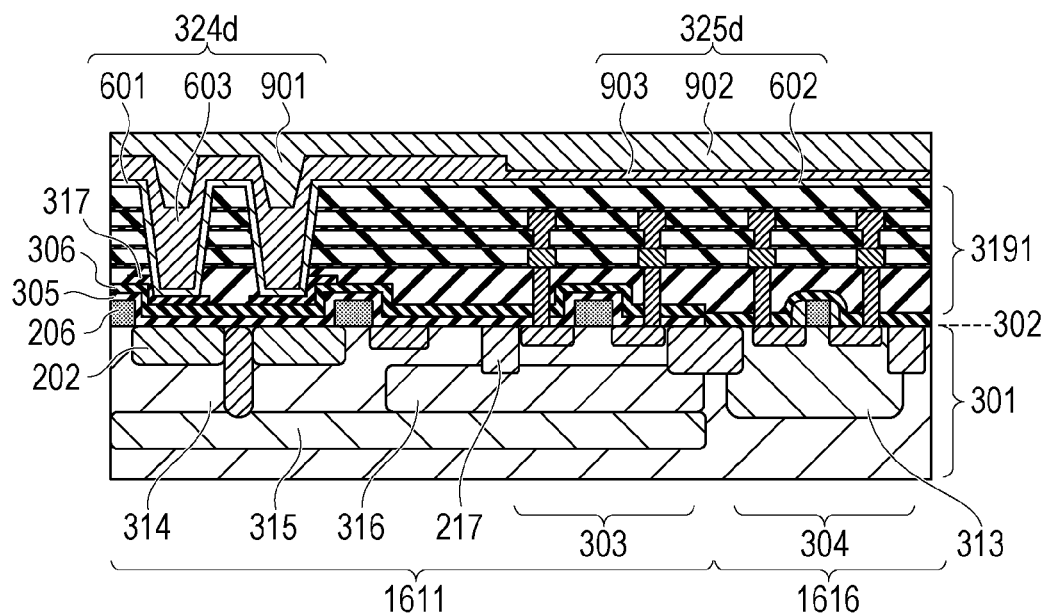
FIGS. 9A and 9B are schematic cross-sectional views illustrating a solid-state image pickup device according to a fourth embodiment.
Figure 9B:
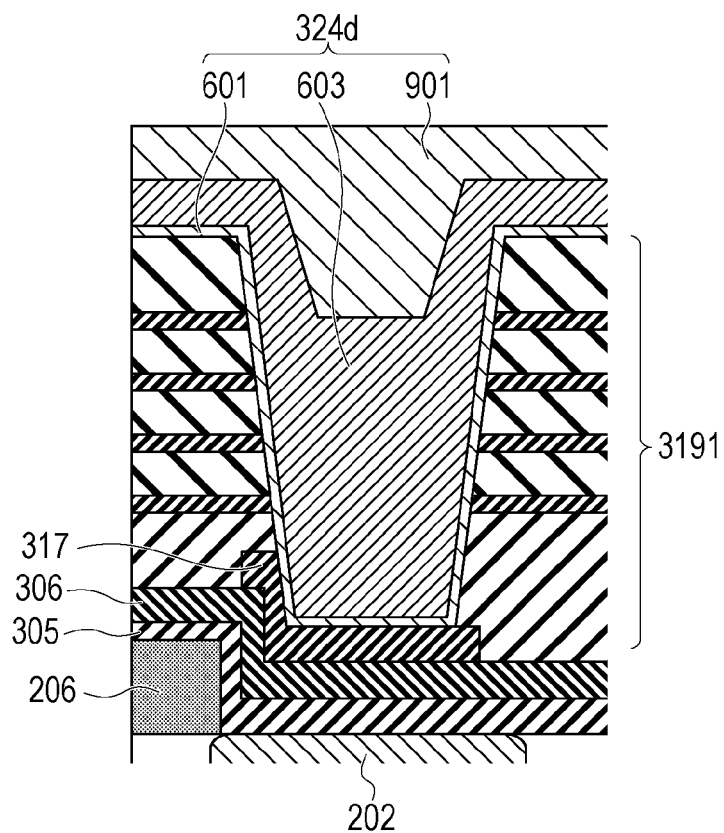

This embodiment is different from the first embodiment in that the high-refractive-index members 324 and the insulating film 325 are formed in three steps (with three members). The other portions of the structure and the production method are the same as those in the first embodiment. FIG. 9A is a schematic cross-sectional view of a solid-state image pickup device corresponding to that illustrated in FIG. 6A. FIG. 9B is an enlarged fragmentary schematic cross-sectional view of a solid-state image pickup device corresponding to that illustrated in FIG. 6B. As illustrated in FIG. 9A, a high-refractive-index member 324d and an insulating film 325d each include three members. The high-refractive-index member 324d includes the first member 601, the second member 603, and a third member 901. The insulating film 325d includes the insulating film 602, an insulating film 903, and an insulating film 902. The insulating film 903 is a member in which the insulating film 604 illustrated in FIG. 6A is partially removed.

In a production method illustrated in FIG. 9A, after the first step and the second step described in the first embodiment are performed, an etching step of partially removing the insulating film 604, illustrated in the FIG. 6A, formed in the second step is performed by etching. Here, the insulating film 604 illustrated in FIG. 6A is formed into the insulating film 903. Then a third step of forming the third member 901 and the insulating film 902 is performed under the same conditions as those in the second step. In this way, the etching step is performed in the middle of the process. This facilitates planarization after the formation of the high-refractive-index member 324d and the insulating film 325d. Partial removal of the insulating film 604 illustrated in FIG. 6A results in a reduction in stress, thus reducing the occurrence of cracking and the detachment of the high-refractive-index member. The three members may be integrated.

Fifth Embodiment

Figure 10:
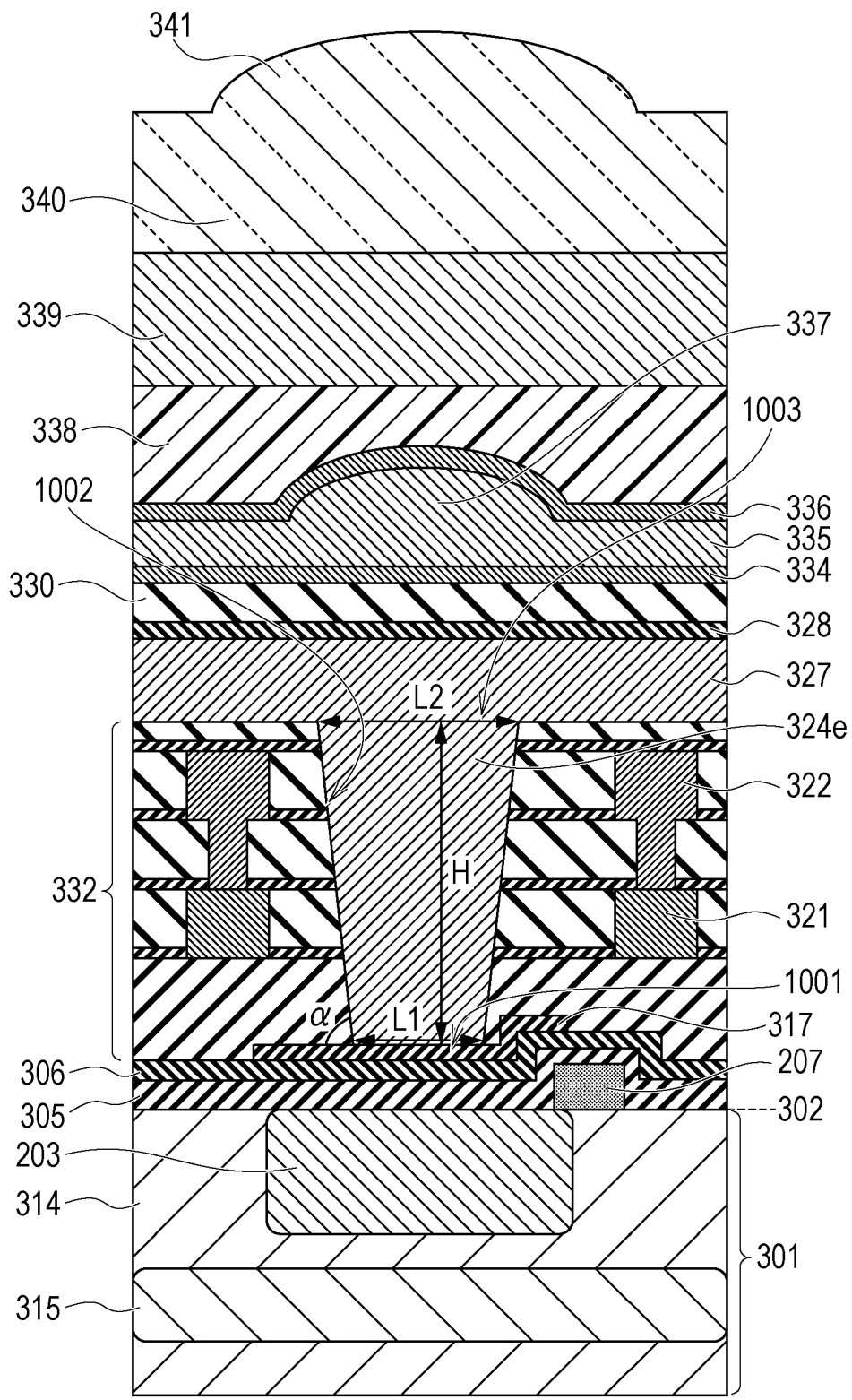
FIG. 10 is a schematic cross-sectional view of a solid-state image pickup device according to a fifth embodiment.

According to this embodiment, the shape of each of the openings 323 illustrated in FIG. 4A will be described below with reference to FIG. 10. FIG. 10 is an enlarged view of a structure corresponding to that in FIG. 5B. Common elements are designated using the same reference numerals, and descriptions are not redundantly repeated. The other portions of the structure and the production method are the same as those in the first embodiment.

The shape of each opening 323 illustrated in FIG. 4A, i.e., the shape of a high-refractive-index member 324e, is defined by a bottom face 1001, an upper face 1003, and a side face 1002 that connects the bottom face 1001 and the upper face 1003. The bottom face 1001 and the upper face 1003 are parallel to the main face 302 including a light receiving face. The widest dimension of the bottom face 1001 is represented by L1. The widest dimension of the upper face 1003 is represented by L2. The length of a line segment that connects the upper face 1003 and the bottom face 1001 is represented by height H. The angle of inclination of the side face 1002 to a plane including the bottom face 1001 is represented by α. Height H is perpendicular to the main face 302. The shape of the high-refractive-index member 324e satisfies the following relationships: L1<L2, H/L2≤2, and 72.8°<α<90°. The relationships lead to the formation of the high-refractive-index member 324e without forming a void. The relationships will be described below with reference to FIGS. 11A and 11B.

Figure 11A:
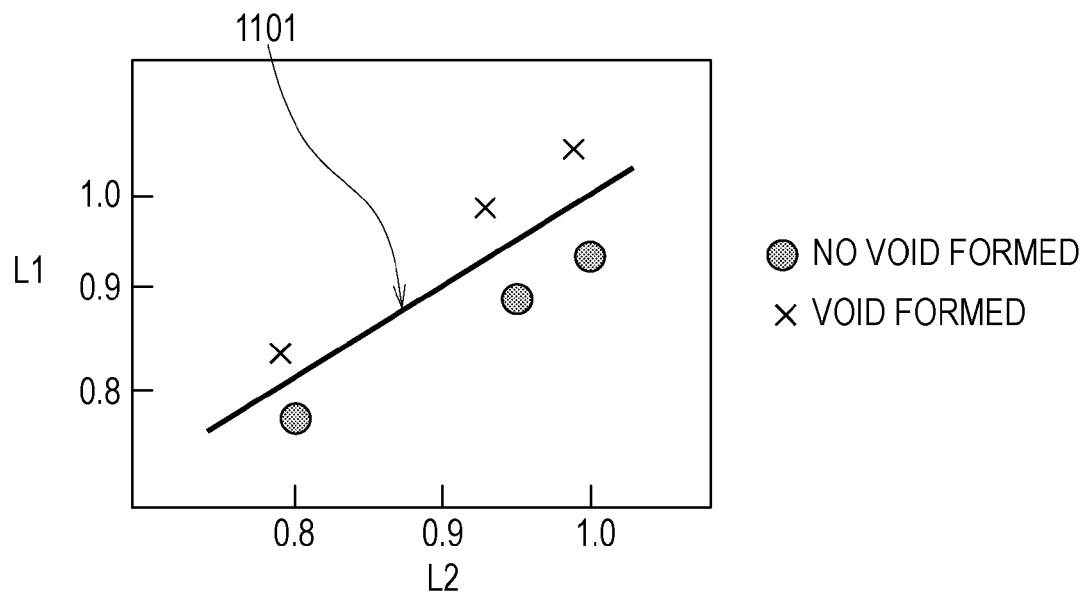
FIGS. 11A and 11B are graphs illustrating the fifth embodiment.
Figure 11B:
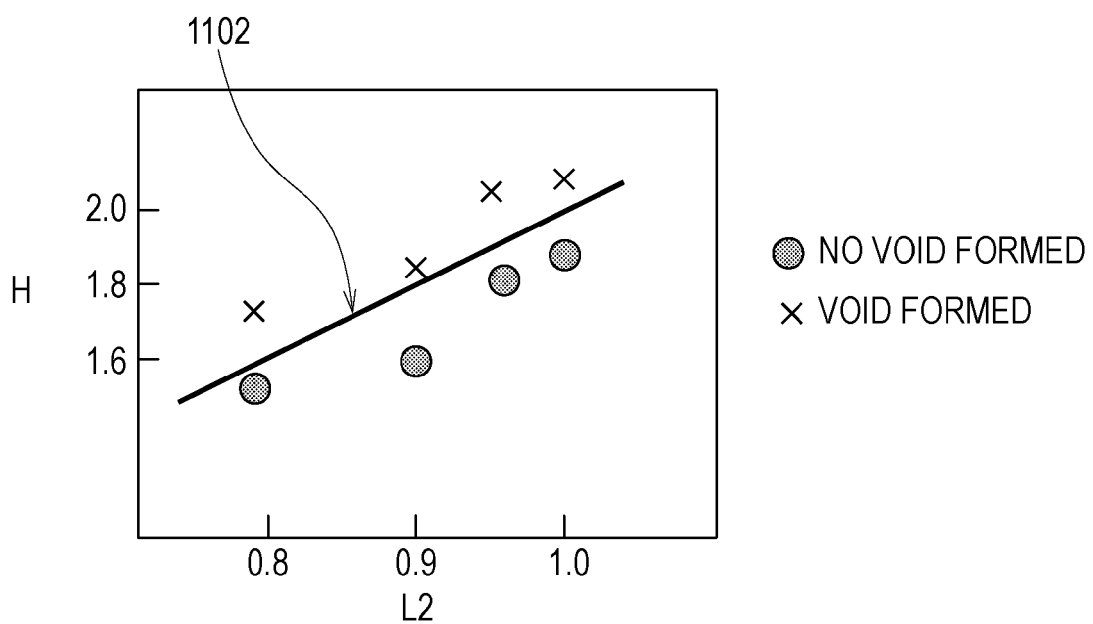

FIG. 11A is a graph illustrating the presence or absence of the formation of a void, the vertical axis representing L1, and the horizontal axis representing L2. FIG. 11B is a graph illustrating the presence or absence of the formation of a void, the vertical axis representing H, and the horizontal axis representing L2. Each value is a ratio with respect to a given value. The measurement is performed on a structure in which the high-refractive-index members according to the first embodiment are arranged. Boundaries are found from FIGS. 11A and 11B. A boundary line 1101 depicted in FIG. 11A indicates that L1=L2. A boundary line 1102 depicted in FIG. 11B indicates that H/L2=2. In regions where L1<L2 and H/L2≤2 in the graphs, it is possible to form the high-refractive-index member 324e without forming a void.

Figure 12:
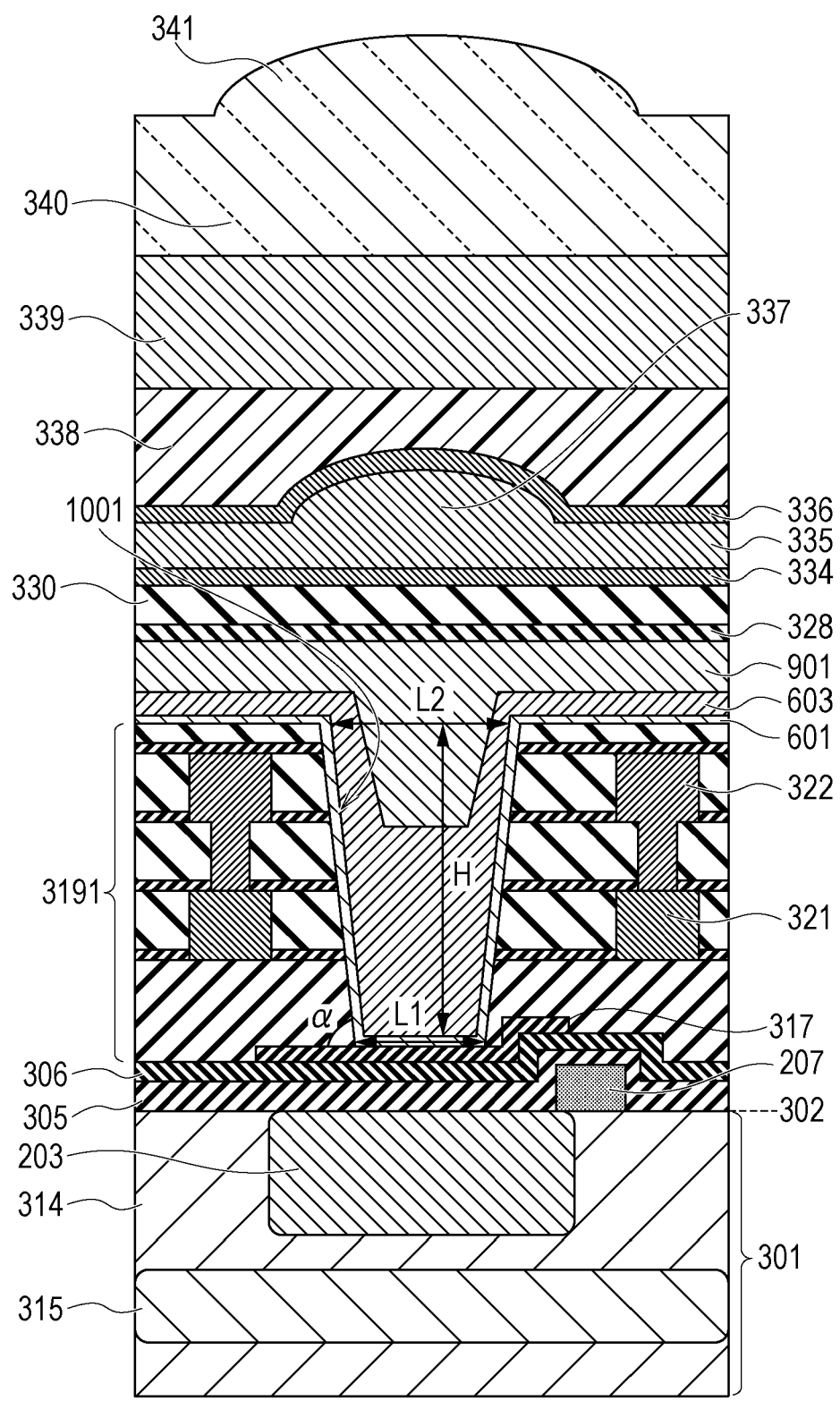
FIG. 12 is a schematic cross-sectional view illustrating a modification of the fifth embodiment.

It is possible to appropriately combine this embodiment with the first to fourth embodiments. For example, FIG. 12 illustrates a structure in which the structure according to this embodiment is combined with the structure according to the fourth embodiment. In FIG. 12, the structure has the cone angle α illustrated in FIG. 10 and the first to third members and the insulating film illustrated in FIGS. 9A and 9B. This structure makes it possible to further reduce the formation of voids.

Sixth Embodiment

The difference between this embodiment and the first embodiment is the method for forming the second member 603 of the high-refractive-index members 324a (see FIG. 6B) (second step). The other portions of the structure and the production method are the same as those in the first embodiment.

Figure 15:
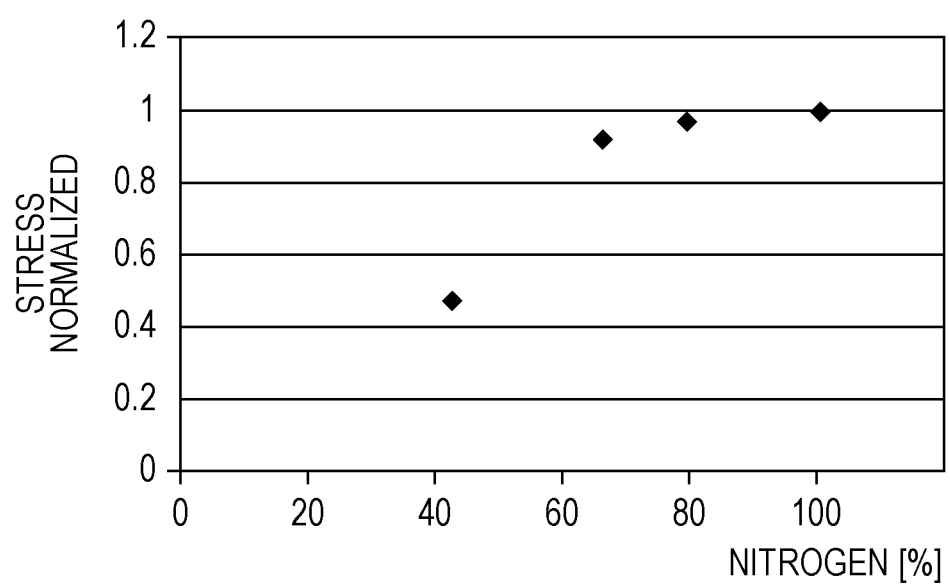
FIG. 15 is a graph illustrating a sixth embodiment.

Here, the relationship between the flow rate of nitrogen and the stress in the high-refractive-index member will be described with reference to FIG. 15. In FIG. 15, the horizontal axis represents the flow rate (sccm) of nitrogen in the chamber of the CVD apparatus when the high-refractive-index member is formed. In this case, the flow rate is normalized in such a manner that a reference flow rate is defined as 100% when the opening can be filled with the high-refractive-index member. The vertical axis represents the stress in the high-refractive-index member. The stress in the high-refractive-index member is measured by uniformly forming the high-refractive-index member on a flat substrate and measuring the stress with a stress measurement device. In this case, the stress is normalized in such a manner that a reference stress in the high-refractive-index member is defined as 1 when a nitrogen flow rate at which the opening can be filled with the high-refractive-index member is set. FIG. 15 demonstrates that a lower nitrogen flow rate results in a lower stress in the high-refractive-index member in the second step according to the first embodiment. Note that a reduction in the flow rate of nitrogen is offset by an increase in the flow rate of helium.

Table 1 illustrates the success or failure of filling at various pressures (mTorr) in the chamber. Evaluation criteria are described below.

Good: The openings were filled with the high-refractive-index member.

Bad: The openings were not filled with the high-refractive-index member.

TABLE 1

| | Pressure (mTorr) | | | | | |
|---|---|---|---|---|---|---|
| | 2.8 | 3.0 | 6.0 | 9.0 | 10.0 | 12.0 | 13.0 |
| Success or failure of filling | bad | good | good | good | good | bad | bad |

Table 1 demonstrates that the pressure in the chamber is preferably in the range of 3 mTorr to 10 mTorr and more preferably 6 mTorr to 9 mTorr.

FIG. 15 and Table 1 demonstrate the following: The use of helium in addition to nitrogen makes it possible to fill the openings with a low-stress film. A pressure in the chamber of 3 mTorr to 10 mTorr facilitates the filling. In the case where the flow rate of nitrogen is reduced, the flow rate of helium is increase, and the pressure in the chamber is in the range of 3 mTorr to 10 mTorr, it is possible to fill the openings with a silicon nitride film having a lower stress.

Seventh Embodiment

The difference between this embodiment and the first embodiment is the method for forming the first member 601 of the high-refractive-index members 324a (see FIG. 6B) (first step). The other portions of the structure and the production method are the same as those in the first embodiment. In this embodiment, in the first step of forming the high-refractive-index members 324a, a silicon nitride film is formed by parallel-plate plasma-enhanced CVD, thereby providing the first member. In the first step according to this embodiment, a silicon-containing gas, nitrogen, and a nitrogen-containing gas are fed, and the silicon nitride film is formed. The silicon nitride film may have a thickness of 10 nm or more in the same way as in the first embodiment. A thickness of larger than 10 nm result in stronger adhesion. Thus, the resulting high-refractive-index members will not be detached in the subsequent step. The second step is performed by high-density plasma-enhanced CVD in the same way as in the first embodiment, thereby filling the openings. In this embodiment, the silicon nitride film formed by the parallel-plate plasma-enhanced CVD in the first step has a low stress compared with the silicon nitride film formed by the high-density plasma-enhanced CVD in the first step according to the first embodiment. This allows the high-refractive-index members 324a to have a reduced stress, thereby inhibiting the detachment of the high-refractive-index members.

Image Pickup System

The configuration of an image pickup system will be described with reference to FIG. 14. FIG. 14 is a block diagram of a solid-state image pickup device and an image pickup system. An image pickup system 1600 includes the solid-state image pickup device 1601 and a signal processing unit 1602 into which an electric signal is fed from the solid-state image pickup device 1601 and which processes the electric signal. Specifically, electric signals are fed from OUT1 and OUT2 of the solid-state image pickup device 1601 to IN of the signal processing unit 1602. Image signals, driving signals, and control signals are fed from OUT3 of the signal processing unit 1602 in response to the results of the processing of the electric signals. As the electric signals, current signals, voltage signals, analog signals, or digital signals may be used. The solid-state image pickup device 1601 may be used for image sensors, focus detection sensors, light-quantity detection sensors, and so forth. The signal processing unit 1602 processes input electric signals and feeds image signals, driving signals to drive a lens, and control signals to control an exposure time. The image pickup system provides suitable image signals or control signals that may be used for control.

As has been described above, according to these embodiments, it is possible to achieve at least one of improvement in adhesion, the inhibition of the deformation of the wafer, and the reduction of the formation of voids. These embodiments may be appropriately modified and combined with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026346 filed Feb. 9, 2011 and No. 2011-223302 filed Oct. 7, 2011, which are hereby incorporated by reference herein in their entirety.

What is claimed is:

1. A method for manufacturing a solid-state image pickup device that includes
   a substrate including a photoelectric conversion unit, and
   a waveguide arranged on the substrate, and including a plurality of insulating films having an opening and a member comprising a first silicon nitride film and a second silicon nitride film, the member being arranged in the opening in such a manner as to correspond to the photoelectric conversion unit, the method comprising:
   a first step and a second step,
   wherein in the first step, the first silicon nitride film is formed in the opening by a high-density plasma-enhanced chemical vapor deposition apparatus including an upper electrode and a lower electrode,
   wherein after the first step, in the second step, the second silicon nitride film is formed by the high-density plasma-enhanced chemical vapor deposition apparatus under conditions in which a ratio of a radio-frequency power of the lower electrode to a radio-frequency power of the upper electrode is higher than that in the first step.

2. The method according to claim 1,
   wherein, in the first step and the second step, a mixed gas that contains a silicon-containing gas, nitrogen, a nitrogen-containing gas, and an inert gas is fed.

3. The method according to claim 1, wherein the first silicon nitride film has a thickness of 10 nm to 50 nm.

4. The method according to claim 1, further comprising:
   a third step of forming a third silicon nitride film, the member including the third silicon nitride film,
   wherein the third step is performed between the first step and the second step under a condition in which the ratio of the radio-frequency power of the lower electrode to the radio-frequency power of the upper electrode is set to a value that is intermediate between a value of the ratio in the first step and a value of the ratio in the second step.

5. The method according to claim 1, further comprising:
after the second step, removing a part of the first and second silicon nitride films by etching.

6. The method according to claim 1,
wherein the second silicon nitride film comprises silicon nitride containing Si—H bonds and N—H bonds, and
wherein the second silicon nitride film has a ratio of the N—H bonds to the Si—H bonds of 1.0 to 10.

7. The method according to claim 1, wherein in the second step, the second nitride film is formed under a condition in which a deposition rate from a bottom face of the opening to an upper side of the opening in a direction perpendicular to a main face of the substrate is 1.5 to 10 times a deposition rate from a side face of the opening to a center of the opening in a direction parallel to the main face of the substrate.

8. The method according to claim 1,
wherein the opening has a bottom face with a width of L1, an upper face with a width of L2, and a side face with an angle of inclination of α to a main face of the substrate, the upper face having a height above the bottom face of H, and
wherein the opening satisfies L1<L2, H/L2≤2, and 72.8°<α<90°.

9. The method according to claim 2,
wherein in the second step, the inert gas contains at least helium, and
wherein a pressure in a chamber of the high-density plasma-enhanced chemical vapor deposition apparatus for forming the member is in the range of 3 mTorr to 10 mTorr.

10. A method for manufacturing a solid-state image pickup device that includes
a substrate including a photoelectric conversion unit, and a waveguide arranged on the substrate, and including a plurality of insulating films having an opening and a silicon nitride member, the silicon nitride member being arranged in the opening in such a manner as to correspond to the photoelectric conversion unit, the method comprising:
forming the silicon nitride member including a first step and a second step,
wherein in the first step, a first member of the silicon nitride member is formed in the opening by a high-density plasma-enhanced chemical vapor deposition apparatus including an upper electrode and a lower electrode,
wherein after the first step, in the second step, a second member of the silicon nitride member is formed on the first member by the high-density plasma-enhanced chemical vapor deposition apparatus under conditions in which a ratio of a radio-frequency power of the lower electrode to a radio-frequency power of the upper electrode is higher than that in the first step.

* * * * *